(12) United States Patent
Gans

(10) Patent No.: US 11,916,527 B2
(45) Date of Patent: *Feb. 27, 2024

(54) APPARATUSES AND METHODS FOR CALIBRATING ADJUSTABLE IMPEDANCES OF A SEMICONDUCTOR DEVICE

(71) Applicant: Lodestar Licensing Group LLC, Evanston, IL (US)

(72) Inventor: Dean Gans, Nampa, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/047,373

(22) Filed: Oct. 18, 2022

(65) Prior Publication Data

US 2023/0137651 A1 May 4, 2023

Related U.S. Application Data

(63) Continuation of application No. 17/119,664, filed on Dec. 11, 2020, now Pat. No. 11,482,989, which is a
(Continued)

(51) Int. Cl.
*H03H 11/28* (2006.01)
*G11C 7/10* (2006.01)
(Continued)

(52) U.S. Cl.
CPC ............. *H03H 11/28* (2013.01); *G11C 7/10* (2013.01); *G11C 29/025* (2013.01);
(Continued)

(58) Field of Classification Search
None
See application file for complete search history.

(56) References Cited

U.S. PATENT DOCUMENTS

| 4,511,959 A | 4/1985 | Nicolas et al. |
| 4,745,548 A | 5/1988 | Blahut |

(Continued)

FOREIGN PATENT DOCUMENTS

| CN | 101256826 A | 9/2008 |
| CN | 101261874 A | 9/2008 |

(Continued)

OTHER PUBLICATIONS

U.S. Appl. No. 15/818,205, titled 'Apparatuses and Methods for Calibrating Adjustable Impedances of a Semiconductor Device', filed Nov. 20, 2017, pp. all pages of application as filed.
(Continued)

*Primary Examiner* — Anh Q Tran

(57) ABSTRACT

Apparatuses and methods for calibrating adjustable impedances of a semiconductor device are disclosed in the present application. An example apparatus includes a register configured to store impedance calibration information and further includes programmable termination resistances having a programmable impedance. The example apparatus further includes an impedance calibration circuit configured to perform a calibration operation to determine calibration parameters for setting the programmable impedance of the programmable termination resistances. The impedance calibration circuit is further configured to program the impedance calibration information in the register related to the calibration operation.

21 Claims, 12 Drawing Sheets

Related U.S. Application Data continuation of application No. 16/505,369, filed on Jul. 8, 2019, now Pat. No. 10,868,519, which is a continuation of application No. 15/834,892, filed on Dec. 7, 2017, now Pat. No. 10,348,270.

(60) Provisional application No. 62/432,494, filed on Dec. 9, 2016.

(51) Int. Cl.
  *G11C 29/02* (2006.01)
  *H03K 19/00* (2006.01)
  *H03H 11/54* (2006.01)

(52) U.S. Cl.
  CPC ....... *G11C 29/028* (2013.01); *H03K 19/0005* (2013.01); *H03H 11/54* (2013.01)

(56) References Cited

U.S. PATENT DOCUMENTS

| | | |
|---|---|---|
| 4,986,183 A | 1/1991 | Jacob et al. |
| 5,254,883 A | 10/1993 | Horowitz et al. |
| 5,729,154 A | 3/1998 | Taguchi et al. |
| 5,894,238 A | 4/1999 | Chien |
| 6,049,221 A | 4/2000 | Ishibashi et al. |
| 6,091,300 A | 7/2000 | Setty et al. |
| 6,262,625 B1 | 7/2001 | Perner et al. |
| 6,307,791 B1 | 10/2001 | Otsuka et al. |
| 6,377,117 B2 | 4/2002 | Oskowsky et al. |
| 6,509,778 B2 | 1/2003 | Braceras et al. |
| 6,556,052 B2 | 4/2003 | Garrett et al. |
| 6,661,860 B1 | 12/2003 | Gutnik et al. |
| 6,674,302 B2 | 1/2004 | Yen |
| 6,768,393 B2 | 7/2004 | Song |
| 6,807,650 B2 | 10/2004 | Lamb et al. |
| 6,836,143 B2 | 12/2004 | Song |
| 6,836,144 B1 | 12/2004 | Bui et al. |
| 6,836,170 B2 | 12/2004 | Kitagawa et al. |
| 6,839,286 B2 | 1/2005 | Cho et al. |
| 6,839,386 B2 | 1/2005 | Sato et al. |
| 6,917,217 B2 | 7/2005 | Herz |
| 6,947,336 B2 | 9/2005 | Kim et al. |
| 6,958,613 B2 | 10/2005 | Braun et al. |
| 6,967,500 B1 | 11/2005 | Lin et al. |
| 7,039,824 B2 | 5/2006 | Simon et al. |
| 7,148,721 B2 | 12/2006 | Park |
| 7,215,128 B2 | 5/2007 | Fujisawa |
| 7,239,198 B1 | 7/2007 | Drapkin et al. |
| 7,269,043 B2 | 9/2007 | Lee |
| 7,323,900 B2 | 1/2008 | Kim |
| 7,362,128 B2 | 4/2008 | Choi et al. |
| 7,414,427 B1 | 8/2008 | Bakker et al. |
| 7,432,731 B2 | 10/2008 | Bains et al. |
| 7,436,202 B2 | 10/2008 | Lin et al. |
| 7,443,193 B1 | 10/2008 | Santurkar et al. |
| 7,495,453 B2 | 2/2009 | Fujisawa |
| 7,626,416 B2 | 12/2009 | Kim |
| 7,646,213 B2 | 1/2010 | Kao |
| 7,852,112 B2 | 12/2010 | Kao |
| 7,898,290 B2 | 3/2011 | Kim |
| 7,902,858 B2 | 3/2011 | Kuwahara et al. |
| 7,973,553 B1 | 7/2011 | Wang et al. |
| 7,990,174 B2 | 8/2011 | Park |
| 8,446,167 B2 | 5/2013 | Kao |
| 8,483,986 B2 | 7/2013 | Riho |
| 9,106,222 B2 | 8/2015 | Kao |
| 9,294,072 B2 | 3/2016 | Kaneko et al. |
| 9,318,183 B2 | 4/2016 | Ware et al. |
| 9,478,267 B1 | 10/2016 | Jeong et al. |
| 9,531,382 B1 | 12/2016 | Miwa et al. |
| 9,614,497 B2 | 4/2017 | Kaneko et al. |
| 9,666,245 B2 | 5/2017 | Aral et al. |
| 9,711,189 B1 | 7/2017 | Wang et al. |
| 9,716,497 B2 | 7/2017 | Cho et al. |
| 9,740,269 B1 | 8/2017 | Tatapudi et al. |
| 9,766,831 B2 | 9/2017 | Gans |
| 9,767,921 B1 | 9/2017 | Pan |
| 9,786,352 B2 | 10/2017 | Yoshida et al. |
| 9,825,631 B1 | 11/2017 | Cho et al. |
| 10,026,457 B2 | 7/2018 | Arai et al. |
| 10,090,064 B2 | 10/2018 | Pan |
| 10,147,721 B1 | 12/2018 | Gada et al. |
| 10,193,711 B2 | 1/2019 | Wieduwilt et al. |
| 10,205,451 B1 | 2/2019 | Johnson |
| 10,269,395 B2 | 4/2019 | Aral et al. |
| 10,348,270 B2 | 7/2019 | Gans |
| 10,361,699 B2 | 7/2019 | Lee et al. |
| 10,504,571 B1 | 12/2019 | Johnson et al. |
| 10,530,613 B2 | 1/2020 | Wieduwilt et al. |
| 10,615,798 B2 | 4/2020 | Gans |
| 10,855,495 B2 | 12/2020 | Wieduwilt et al. |
| 10,868,519 B2 | 12/2020 | Gans |
| 11,121,714 B2 | 9/2021 | Gans |
| 11,212,142 B2 | 12/2021 | Wieduwilt et al. |
| 11,482,989 B2 * | 10/2022 | Gans ............... H03H 11/28 |
| 11,728,812 B2 | 8/2023 | Gans |
| 2002/0063576 A1 | 5/2002 | Kim et al. |
| 2002/0113617 A1 | 8/2002 | Gergintschw et al. |
| 2003/0126356 A1 | 7/2003 | Gustavson et al. |
| 2003/0218914 A1 | 11/2003 | Kim et al. |
| 2003/0231523 A1 | 12/2003 | Cho et al. |
| 2003/0235084 A1 | 12/2003 | Zumkehr et al. |
| 2004/0083070 A1 | 4/2004 | Salmon et al. |
| 2004/0113654 A1 | 6/2004 | Lundberg |
| 2004/0128429 A1 | 7/2004 | Khandekar et al. |
| 2004/0174185 A1 | 9/2004 | Lin et al. |
| 2004/0240255 A1 | 12/2004 | Smith et al. |
| 2005/0040845 A1 | 2/2005 | Park |
| 2005/0110516 A1 | 5/2005 | Ueno |
| 2005/0226080 A1 | 10/2005 | Lee |
| 2006/0158198 A1 | 7/2006 | Fujisawa |
| 2006/0158216 A1 | 7/2006 | Aoyama et al. |
| 2006/0226868 A1 | 10/2006 | Lee et al. |
| 2007/0040573 A1 | 2/2007 | Batt |
| 2007/0126471 A1 | 6/2007 | Jeong |
| 2007/0195604 A1 | 8/2007 | Kim |
| 2007/0200591 A1 | 8/2007 | Kim |
| 2007/0217270 A1 | 9/2007 | Lee et al. |
| 2008/0054935 A1 | 3/2008 | Pan |
| 2008/0068040 A1 | 3/2008 | Morishima et al. |
| 2008/0088338 A1 | 4/2008 | Kim |
| 2008/0164905 A1 | 7/2008 | Hamanaka |
| 2008/0198666 A1 | 8/2008 | Nygren |
| 2008/0211534 A1 | 9/2008 | Jeong et al. |
| 2008/0259697 A1 | 10/2008 | Abe |
| 2008/0284465 A1 | 11/2008 | Kao |
| 2008/0304336 A1 | 12/2008 | Kim et al. |
| 2009/0009212 A1 | 1/2009 | Brox |
| 2009/0146756 A1 | 6/2009 | Fujisawa |
| 2009/0224802 A1 | 9/2009 | Hollis et al. |
| 2010/0097095 A1 | 4/2010 | Kao |
| 2010/0177588 A1 | 7/2010 | Kaiwa et al. |
| 2011/0025373 A1 | 2/2011 | Kim et al. |
| 2011/0066798 A1 | 3/2011 | Kaiwa et al. |
| 2011/0074463 A1 | 3/2011 | Kao |
| 2011/0102073 A1 | 5/2011 | Riho |
| 2011/0128038 A1 | 6/2011 | Ko |
| 2011/0283060 A1 | 11/2011 | Ware et al. |
| 2012/0007631 A1 | 1/2012 | Koo et al. |
| 2012/0056641 A1 | 3/2012 | Kuroki et al. |
| 2012/0099383 A1 | 4/2012 | Kim et al. |
| 2012/0212254 A1 | 8/2012 | Yokou et al. |
| 2013/0015880 A1 | 1/2013 | Haraguchi |
| 2013/0036253 A1 | 2/2013 | Baltar |
| 2013/0066253 A1 | 3/2013 | Bertrand et al. |
| 2013/0088257 A1 | 4/2013 | Hara |
| 2013/0113517 A1 | 5/2013 | Ko |
| 2013/0257475 A1 | 10/2013 | Kao |
| 2013/0311717 A1 | 11/2013 | Kim et al. |
| 2013/0335114 A1 | 12/2013 | Chen et al. |
| 2014/0032890 A1 | 1/2014 | Lee et al. |
| 2014/0097911 A1 | 4/2014 | Kaiwa et al. |
| 2014/0185384 A1 | 7/2014 | Kim et al. |

(56) References Cited

U.S. PATENT DOCUMENTS

| | | |
|---|---|---|
| 2014/0185401 A1 | 7/2014 | Yang et al. |
| 2014/0232429 A1 | 8/2014 | Riho |
| 2015/0019831 A1 | 1/2015 | Van Huben et al. |
| 2015/0022282 A1 | 1/2015 | Kaneko et al. |
| 2015/0067292 A1 | 3/2015 | Grunzke |
| 2015/0117122 A1 | 4/2015 | Lee et al. |
| 2015/0235677 A1 | 8/2015 | Grunzke |
| 2015/0270010 A1 | 9/2015 | Kang |
| 2015/0340069 A1 | 11/2015 | Arai et al. |
| 2015/0364177 A1 | 12/2015 | Lee |
| 2016/0012879 A1 | 1/2016 | Eom et al. |
| 2016/0042769 A1 | 2/2016 | Moran |
| 2016/0118983 A1 | 4/2016 | Cho et al. |
| 2016/0164494 A1 | 6/2016 | Kaneko et al. |
| 2016/0164521 A1 | 6/2016 | Chung et al. |
| 2016/0204782 A1 | 7/2016 | Lee et al. |
| 2016/0284386 A1 | 9/2016 | Mccall et al. |
| 2017/0109091 A1 | 4/2017 | Gans |
| 2017/0109249 A1 | 4/2017 | Tatapudi et al. |
| 2017/0148502 A1 | 5/2017 | Ikarashi |
| 2017/0162238 A1 | 6/2017 | Lee et al. |
| 2017/0221533 A1 | 8/2017 | Arai et al. |
| 2017/0228010 A1 | 8/2017 | Tatapudi et al. |
| 2017/0351451 A1 | 12/2017 | Gans |
| 2018/0167055 A1 | 6/2018 | Gans |
| 2018/0190368 A1 | 7/2018 | Pan |
| 2018/0286467 A1 | 10/2018 | Arai et al. |
| 2018/0375692 A1 | 12/2018 | Wieduwilt et al. |
| 2019/0036740 A1 | 1/2019 | Wieduwilt et al. |
| 2019/0052268 A1 | 2/2019 | Lee et al. |
| 2019/0131972 A1 | 5/2019 | Gans |
| 2019/0238133 A1 | 8/2019 | Johnson |
| 2019/0295609 A1 | 9/2019 | Arai et al. |
| 2019/0334505 A1 | 10/2019 | Gans |
| 2019/0362763 A1 | 11/2019 | Lee et al. |
| 2020/0036560 A1 | 1/2020 | Wieduwilt et al. |
| 2020/0252069 A1 | 8/2020 | Gans |
| 2021/0083909 A1 | 3/2021 | Wieduwilt et al. |
| 2021/0097209 A1 | 4/2021 | Kondo et al. |
| 2021/0099160 A1 | 4/2021 | Gans |
| 2021/0110855 A1 | 4/2021 | Johnson et al. |
| 2021/0149423 A1 | 5/2021 | He et al. |
| 2022/0035539 A1 | 2/2022 | Gans |

FOREIGN PATENT DOCUMENTS

| | | |
|---|---|---|
| CN | 101335516 A | 12/2008 |
| CN | 101552606 A | 10/2009 |
| CN | 104049909 A | 9/2014 |
| CN | 104871012 A | 8/2015 |
| CN | 105512059 A | 4/2016 |
| CN | 106205662 A | 12/2016 |
| JP | H01261025 A | 10/1989 |
| JP | 2000049583 | 2/2000 |
| JP | 2007317229 A | 12/2007 |
| JP | 2009237678 A | 10/2009 |
| JP | 2015216513 A | 12/2015 |
| JP | 2015219936 A | 12/2015 |
| KR | 20050100290 A | 10/2005 |
| KR | 20070036578 A | 4/2007 |
| KR | 1020070088845 A | 8/2007 |
| KR | 20070111388 A | 11/2007 |
| KR | 1020080002692 A | 1/2008 |
| KR | 20080018779 A | 2/2008 |
| KR | 101069733 B1 | 10/2011 |
| KR | 20120016462 A | 2/2012 |
| KR | 101138834 B1 | 5/2012 |
| KR | 1020120087662 A | 8/2012 |
| KR | 20130072054 A | 7/2013 |
| KR | 20140078261 A | 6/2014 |
| KR | 20150050021 A | 5/2015 |
| KR | 20160049830 A | 5/2016 |
| TW | 201225079 A | 6/2012 |
| TW | 201532051 A | 8/2015 |
| TW | 201611030 A | 3/2016 |
| TW | 201640358 A | 11/2016 |
| WO | 2004061853 A2 | 7/2004 |
| WO | 2010144624 A1 | 12/2010 |
| WO | 2015179068 A1 | 11/2015 |
| WO | 2017066161 A1 | 4/2017 |
| WO | 2018107076 A1 | 6/2018 |
| WO | 2018125293 A1 | 7/2018 |
| WO | 2018237272 A1 | 12/2018 |
| WO | 2019089102 A1 | 5/2019 |
| WO | 2019147428 A1 | 8/2019 |

OTHER PUBLICATIONS

U.S. Appl. No. 16/574,814 titled "Timing Based Arbitration Methods and Apparatuses for Calibrating Impedances of a Semiconductor Device" filed Sep. 18, 2019, pp. all pages of application as filed.

U.S. Appl. No. 16/799,668, titled "Apparatuses and Methods for Identifying Memory Devices of a Semiconductor Device Sharing an External Resistance", dated Feb. 24, 2020, pp. all pages of application as filed.

U.S. Appl. No. 17/107,671 titled "Timing Based Arbitration Methods and Apparatuses for Calibrating Impedances of a Semiconductor Device" filed Nov. 30, 2020, pp. all pages of application as filed.

U.S. Appl. No. 17/119,664 titled "Apparatuses and Methods for Calibrating Adjustable Impedances of a Semiconductor Device" filed Dec. 11, 2020, pp. all pages of application as filed.

Extended European Seach Report dated Jul. 8, 2020 for EP Application No. 17877602.7, 8 pgs.

EP Office Action dated Jan. 20, 2022 for EP Appl. No. 17877602.7, pp. all.

International Search Report and Written Opinion dated Mar. 29, 2018 for PCT Application No. PCT/US2017/065391, pp. all.

IPRP dated Jun. 20, 2019 for PCT Appl. No. PCT/US2017/065391, 12 pages.

KR Final Office Action dated Feb. 22, 2021 for KR Application No. 10-2019-7019420, pp. all.

KR Office Action dated Apr. 19, 2021 for KR Application No. 10-2021-7008774, pp. all.

KR Office Action dated Jan. 13, 2021 for KR Application No. 10-2019-7019420, pp. all.

KR Office Action dated Jul. 3, 2020 for KR Application No. 10-2019-7019420, pp. all.

U.S. Appl. No. 14/883,377, titled "Apparatuses and Methods for Arbitrating a Shared Terminal for Calibration of an Impedance Termination", filed Oct. 14, 2015, pp. all pages of application as filed.

U.S. Appl. No. 15/396,259, titled "Timing Based Arbiter Systems and Circuits For ZQ Calibration," filed Dec. 30, 2016, pp. all pages of application as filed.

U.S. Appl. No. 14/883,454, titled "Apparatuses and Methods for Arbitrating a Shared Terminal for Calibration of an Impedance Termination", filed Oct. 14, 2015, pp. all pages of application as filed.

U.S. Appl. No. 16/440,565 titled "Device Having Multiple Channels With Calibration Circuit Shared by Multiple Channels" filed Jun. 13, 2019, pp. all pages of application as filed.

U.S. Appl. No. 17/444,771 titled "Apparatuses and Methods for Identifying Memory Devices of a Semiconductordevice Sharing an External Resistance" filed Aug. 10, 2021, pp. all pages of application as filed.

U.S. Appl. No. 15/630,901, titled "Timing Based Arbitration Methods and Apparatuses for Calibrating Impedances of a Semiconductor Device" filed Jun. 22, 2017, pp. all pages of application as filed.

U.S. Appl. No. 15/683,439, titled "Timing Based Arbiter Systems and Circuits for ZQ Calibration", filed Aug. 22, 2017, pp. all pages of application as filed.

U.S. Appl. No. 15/683,540, titled Apparatuses and Methods for Arbitrating a Shared Terminal for Calibration of an Impedance Termination, filed Aug. 22, 2017, pp. all pages of application as filed.

U.S. Appl. No. 15/997,417, titled "Device Having Multiple Channels With Calibration Circuit Shared by Multiple Channels" filed Jun. 4, 2018, pp. all pages of application as filed.

(56) References Cited

OTHER PUBLICATIONS

U.S. Appl. No. 16/008,955, titled "Apparatuses and Methods for Identifying Memory Devices of a Semiconductor Device Sharing an External Resistance" filed Jun. 14, 2018, pp. all pages of application as filed.

U.S. Appl. No. 16/034,233, titled "Methods and Apparatuses for Dynamic Step Size for Impedance Calibration of a Semiconductor Device" filed Jul. 12, 2018, pp. all pages of application as filed.

U.S. Appl. No. 16/146,489 titled "Timing Based Arbitration Methods and Apparatuses for Calibrating Impedances of a Semiconductor Device", filed Sep. 28, 2018; pp. all pages of application as filed.

U.S. Appl. No. 16/505,369 titled "Apparatuses and Methods for Calibrating Adjustable Impedances of a Semiconductor Device" filed Jul. 8, 2019, pp. all pages of application as filed.

U.S. Appl. No. 16/688,870, titled "Apparatuses and Methods for ZQ Calibration", filed Nov. 19, 2019, pp. all pages of application as filed.

U.S. Appl. No. 16/987,262, titled "Apparatuses and Methods for ZQ Calibration", dated Aug. 6, 2020, pp. all pages of application as filed.

U.S. Appl. No. 15/882,723 titled 'Methods and Apparatuses for Dynamic Step Size for Impedance Calibration of a Semiconductor Device' filed Jan. 29, 2018, pp. all pages of application as filed.

First Office Action for TW application No. 106143130 dated Aug. 24, 2018, pp. all.

U.S. Appl. No. 15/834,892 titled "Apparatuses and Methods for Calibrating Adjustable Impedances of a Semiconductor Device", filed Dec. 7, 2017, pp. all pages of application as filed.

"On Die Termination", DDR II Topic, Aug. 2005, 2 pgs.

Singh, et al., "MOUSETRAP: High-Speed Transition-Signaling Asynchronous Pipelines", IEEE Transactions on Very Large Scale Integration (VLSI) Systems, vol. 15, No. 6, Jun. 2007, 15 pages.

EN translation of CN Office Action dated Nov. 10, 2022 for CN Application No. 201780075169.5; pp. all.

\* cited by examiner

APPARATUSES AND METHODS FOR CALIBRATING ADJUSTABLE IMPEDANCES OF A SEMICONDUCTOR DEVICE

CROSS-REFERENCE TO RELATED APPLICATIONS

This application is a continuation of U.S. patent application Ser. No. 17/119,664 filed Dec. 11, 2020 and issued as U.S. Pat. No. 11,482,989 on Oct. 25, 2022, which is a continuation of U.S. patent application Ser. No. 16/505,369 filed Jul. 8, 2019 and issued as U.S. Pat. No. 10,868,519 on Dec. 15, 2020, which is a continuation of U.S. patent application Ser. No. 15/834,892 filed Dec. 7, 2017 and issued as U.S. Pat. No. 10,348,270 on Jul. 9, 2019, which further claims the filing benefit of U.S. Provisional Application No. 62/432,494, filed Dec. 9, 2016. The aforementioned applications, and issued patents, are incorporated by reference herein in their entirety and for all purposes.

BACKGROUND

Semiconductor devices such as microcomputers, memories, gate arrays, among others, include input/output pins and an output circuit for transmitting data to other devices, via a bus, transmission lines formed on a board, and the like. A circuit within the semiconductor device that is responsible for transmitting data includes, for example, output buffers and drivers. For there to be optimum transmission, the impedance of the transmitting device should be matched to the impedance of the transmission network and receiving device.

As operational speeds of electronic devices increase, the swing of transmitted signals decreases. However, as the signal swing width of a transmitted signal decreases, external noise increases. External noise can affect the reflection characteristics of an output signal if there is an impedance mismatch at an interface. Impedance mismatches are caused by external noise or by noise on a power supply voltage, temperature and process variations, among others. If an impedance mismatch arises, the transmission speed of the data decreases, and the data from a semiconductor device may become distorted. Thus, in a case where a semiconductor device receives distorted data, problems can be caused by setup/hold failures or errors in reading received data.

In order to mitigate these adverse scenarios, memory devices may include programmable termination components that may be used to provide adjustable on-die termination and adjustable output driver impedance. The on-die termination may be adjusted to reduce impedance mismatch, for example, when signals (e.g., command, data, etc.) are provided to the memory devices. The programmable termination components have impedance values that can be adjusted as operating conditions change. In some implementations, programmable termination components are calibrated based on voltage measurements made on a circuit node that couples to an external resistance.

In some cases, a limited number of external connections are available for coupling to an external resistance. These external connections may be shared between multiple devices that use the connection for calibration purposes. As a result, contention for use of the external connection may arise when two or more devices attempt to concurrently use the external connection for a calibration operation.

Calibration of the programmable termination components typically occurs in response to a memory command, which is provided to the memory device, for example, at power up, memory device reset, changing a frequency set point for memory device operation, or whenever initiating a calibration process is desired. Following a time period after the initiation of the calibration process, another memory command is provided to the memory device to apply the parameters determined during the calibration process to set the programmable termination components accordingly. The time period may be set by operating specifications for the memory device.

As the number of memory devices that are coupled to a shared external resistance for the calibration increases, it may become more difficult to complete the calibration process for all of the memory devices before the end of the time period. In a system including multiple devices, the calibration operations for all of the devices must be completed before the specified time period has elapsed in order for calibration parameters to be applied when the following memory command is provided. Where multiple devices are coupled to a shared external resistance, calibration operations occur one device at a time in order to avoid contention for using the external resistance. Nonetheless, the total time to perform the calibration operations for all of the multiple devices must be less than the time period. As systems include more and more devices, the total time to complete the calibration operations for all of the devices becomes longer. At some point, it will not be practical for calibration operations for all of the devices of a system to be completed within the specified time period.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
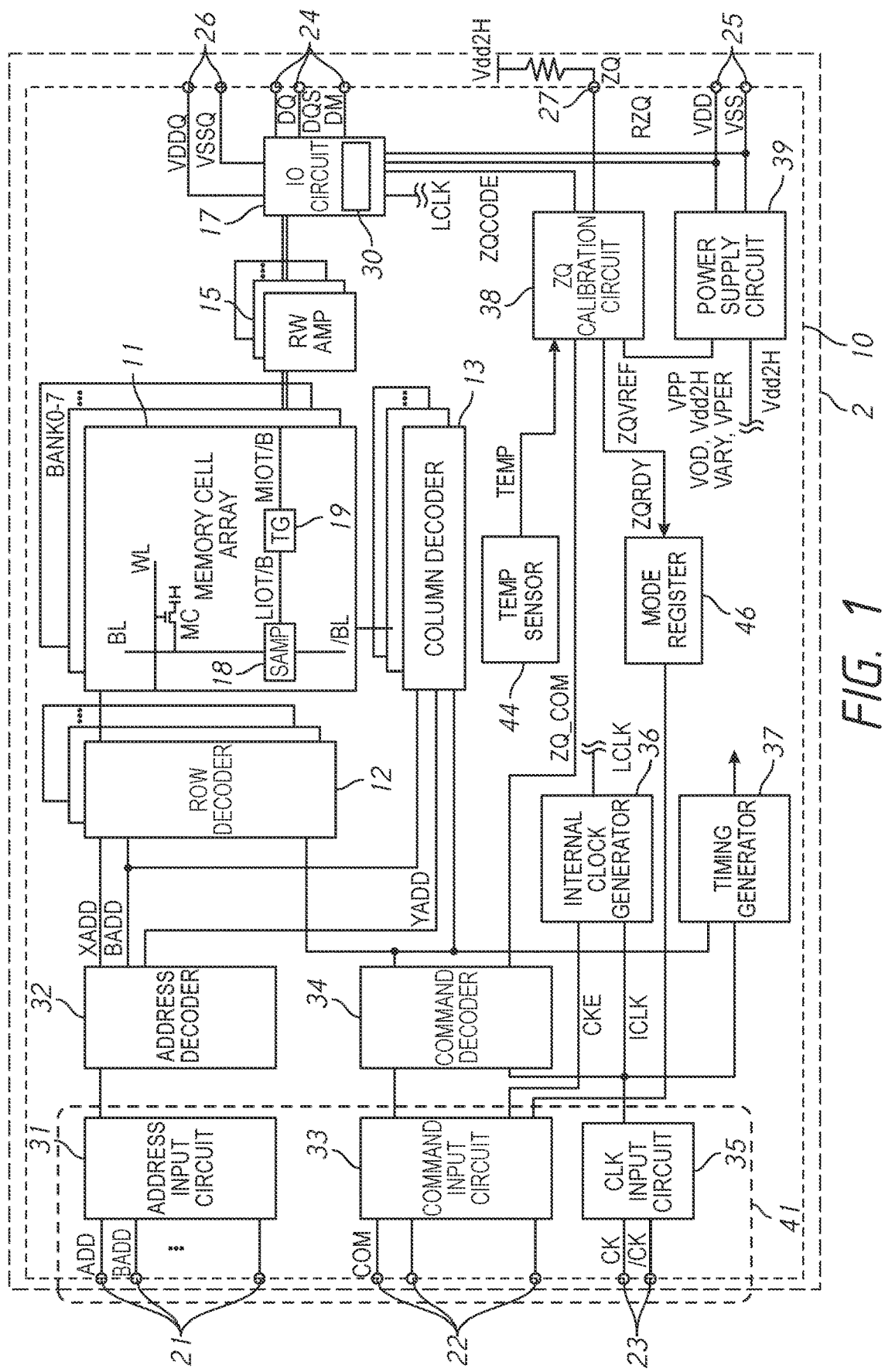
FIG. 1 is a block diagram of a semiconductor device according to an embodiment of the disclosure.

FIG. 1 is a block diagram of a semiconductor device 10 according to an embodiment of the disclosure. The semiconductor device 10 may be a MR5 SDRAM integrated into a single semiconductor chip, for example. The semiconductor device 10 may be mounted on an external substrate 2 that is a memory module substrate, a mother board or the like. The external substrate 2 employs an external resistance RZQ that is coupled to a calibration terminal ZQ 27 of the semiconductor device 10. The external resistance RZQ is a reference impedance used by impedance (ZQ) calibration circuit 38. In the present embodiment, the external resistance RZQ, which may also be referred to as an external ZQ resistor, is coupled to a power supply voltage. In some embodiments, the impedance of the external resistance RZQ is 240 ohms. In some embodiments of the disclosure the power supply voltage to which the external resistance RZQ is coupled may be a power supply voltage Vdd2H, as will be described in more detail below. However, the scope of the disclosure is not limited to the external resistance RZQ being coupled to the power supply voltage Vdd2H, and the external resistance RZQ may be coupled to another power supply in another embodiment of the disclosure. For example, in other embodiments of the disclosure the external resistance RZQ may be connected to a power supply voltage VDDQ, or to another power supply voltage.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23. A data interface block 42 includes the data terminals 24. The data terminals 24 may be coupled to output buffers for read operations of memories. Alternatively, the data terminals 24 may be coupled to input buffers for read/write access of the memories that will be later described. FIG. 1 shows an example of dynamic random access memory (DRAM), however, any device having external terminals for signal input/output may be included as the external terminals of embodiments of the disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line, and a calibration signal ZQ_COM provided to the calibration circuit 38.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address. The input/output circuit 17 may include input buffers and output buffers, according to one embodiment. The input/output circuit 17 may include programmable termination components 30. The programmable termination components 30 of the input/output circuit 17 may be set to provide impedances of the input buffer and output buffer of the input/output circuit 17 previously described, the impedance of the programmable termination components may be used to reduce impedance mismatch.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal dock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

A temperature sensor 44 senses a temperature of the semiconductor device 10 and provides a TEMP signal, which is indicative of a temperature of the semiconductor device 10. In some embodiments, the TEMP signal may be a digital signal having a value indicative of a temperature of the semiconductor device. In some embodiments, the TEMP signal may have a voltage level indicative of a temperature of the semiconductor device. For example, a value of the VTEMP signal may increase if the temperature of the semiconductor device increases.

A mode register 46 is used to define various modes of programmable operations and configurations of the semiconductor device 10. The mode register retains the stored information until it is reprogrammed, reset, or the semiconductor device 10 loses power. The mode register 46 is programmed via a mode register write command. The mode register 46 may include one or more registers for storing information related to the different operations and configurations. For example, the mode register may be used to set burst length, burst type, CAS latency, frequency set point, enable programmable termination components, as well as others. The mode register 46 may also be programmed with information that can be read to provide status information about the semiconductor device 10. For example, the mode register may be used to provide a ready status, calibration status, as well as other status information. The information that is read may be programmed by circuits of the semiconductor device 10. The mode register 46 may be read via a mode register read command. Reading the mode register 46 allows information about the status of operations and configurations to be provided by the semiconductor device 10.

The power supply terminals 25 are supplied with power supply voltages VDD and VSS. These power supply voltages VDD and VSS are supplied to an internal power supply circuit 39. The internal power supply circuit 39 generates various internal voltages VPP, VOD, VARY, VPERI, Vdd2H and a reference voltage ZQVREF. The Vdd2H voltage may be an internal voltage used as an output voltage to drive output signals. The internal voltage VPP is mainly used in the row decoder 12, the internal voltages VOD and VARY are mainly used in the sense amplifiers 18 included in the memory cell array 11, and the internal voltage VPERI is used in many other circuit blocks. The reference voltage ZQVREF is used by the calibration circuit 38. In some embodiments, the ZQVREF is based on the Vdd2H voltage.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD and VSS that are supplied to the power supply terminals 25, respectively. However, the dedicated power supply voltages VDDQ and VSSQ may be used for the input/output circuit 17 so that power supply noise generated by the input/output circuit 17 does not propagate to the other circuit blocks.

The power supply voltage VDDQ may change during operation. For example, the power supply voltage VDDQ may change from a relatively low voltage (e.g., 0.3 volts) to a relatively high voltage (e.g., 0.5 volts), and vice versa. The power supply voltage VDDQ may be changed when a frequency set point of the semiconductor device 10 is changed. Changing frequency set point for the semiconductor device 10 changes the frequency of operation, for example, the operating speed of the input/output circuits 17. Lower frequencies of operation may operate without the use of on-die terminations, while higher frequencies of operation may require using on-die terminations to mitigate impedance mismatch. Lower voltages may be used for lower frequencies of operation due to reduced voltage swing from being unterminated, whereas higher voltages are used for higher frequencies of operation. For example, when switching from a relatively low frequency set point to a higher frequency set point the power supply voltage VDDQ may change from relatively low voltage to a higher power supply voltage VDDQ. Conversely, when switching from a relatively high frequency set point to a lower frequency set point the power supply voltage VDDQ may change from relatively high voltage to a lower power supply voltage VDDQ. In some examples, external resistance RZQ is connected to the power supply voltage VDDQ.

The calibration circuit 38 include circuits to perform calibration operations when activated by the calibration signal ZQ_COM. The calibration operations may be performed with reference to an impedance of an external resistance RZQ and the reference voltage ZQVREF. The calibration circuit 38 is coupled to the calibration terminal ZQ 27. In embodiments where a plurality of semiconductor devices 10 have respective calibration terminals ZQ 27 coupled to an external resistance RZQ, the calibration circuit 38 arbitrates amongst the plurality of semiconductor devices 10 for use of the external resistance RZQ during calibrations operations. During a calibration operation, the calibration circuit 38 calibrate impedances of programmable termination components to the external resistance RZQ by determining appropriate calibration parameters that are used to set the programmable termination component impedance. The calibration parameters determined by the calibration circuit 38 during the calibration operation may be stored by the calibration circuit 38. The stored calibration parameters may be retrieved and applied to the programmable termination components. An impedance code ZQCODE representing calibration parameters is supplied to the input/output circuit 17 to set the programmable termination components to the desired impedance for the buffers of the input/output circuit 17.

The calibration circuit 38 programs calibration information ZQRDY into the mode register 46. The calibration information ZQRDY reflects an aspect of the calibration operation. For example, in some embodiments the value of the calibration information ZQRDY programmed in the mode register 46 represents whether the calibration operation is completed. In some embodiments the value of the calibration information ZQRDY represents whether any new calibration parameters have been determined by a calibration circuit 38. The mode registers 125 may be queried, for example, by a memory controller, to retrieve the calibration information reflecting an aspect of the calibration operation, for example, completion of the calibration operations and/or new calibration parameters have been determined.

Providing the calibration information to be queried allows for a memory controller to be informed as to an aspect of the calibration operation. In some embodiments, the calibration information may be used by the memory controller to determine when to issue a command to apply the calibration parameters, rather than issuing the command at the end of a time period under the assumption that all devices have completed calibration operations. As previously described, as systems include more and more devices, completing calibration operations for the multiple device system within the time period becomes very challenging. By programming calibration information into the mode registers, a memory controller can determine when to issue the command to apply the calibration parameters by periodically reading the mode register rather than idling until the calibration operations are completed.

In some embodiments, following completion of the calibration operation for a power up sequence, the calibration parameters may be applied by the semiconductor device without relying on any commands from a memory controller. For example, the semiconductor device applies the calibration parameters automatically after determining the calibration operation is completed without waiting for a command from the memory controller. In this manner, the memory controller does not need to be involved with the calibration of impedances during a power up sequence. The memory controller, however, may check the status of the calibration operation by checking the calibration information in the mode register.

Programming calibration information into the mode registers also allows the total time for the calibration operations to exceed the time period without negatively impacting power up time due to the memory controller idling until the calibration operations for all of the devices are completed. Additionally, in some embodiments, the calibration parameters are applied to set impedances without the need to receive a command to do so. The calibration parameters may be applied automatically after completing the calibration operations. More generally, completion of calibration operations for the devices is not rushed, and the memory controller may perform other start up related operations during the time for the calibration operations.

Figure 2A:
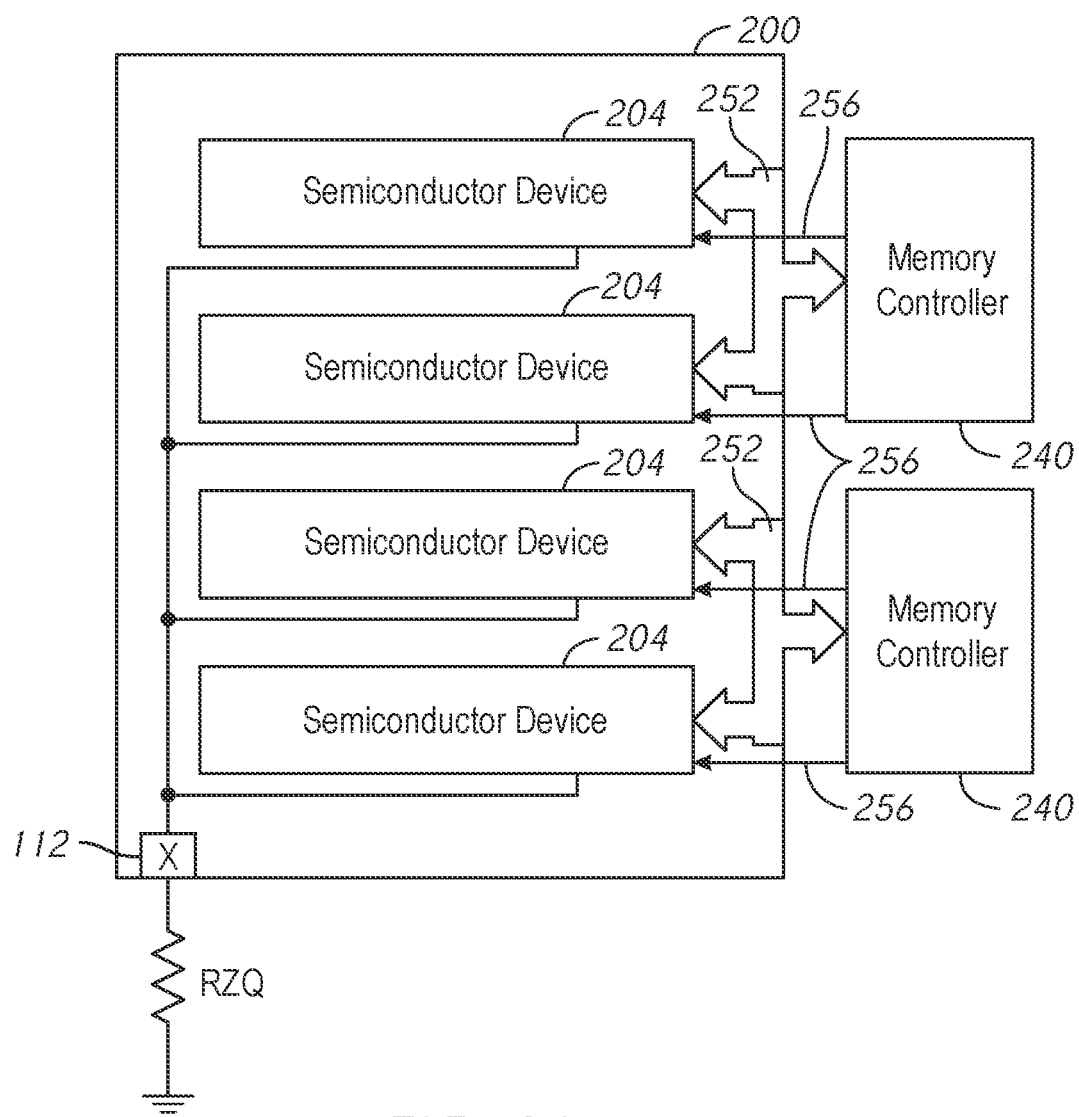
FIG. 2A is a block diagram of a semiconductor memory according to an embodiment of the disclosure coupled to memory controllers.

FIG. 2A is a block diagram of a semiconductor memory 200 according to an embodiment of the disclosure. The semiconductor memory 200 may be a volatile memory such as a SRAM or DRAM, or a non-volatile memory such as a FLASH memory or a ferroelectric memory. In one embodiment, the Double Data Rate (DDR) memory, such as a Low Power Double Data Rate 5 (LPDDR5) memory. In accordance with various embodiments, the semiconductor memory 200 may include a plurality of individual semiconductor devices 204 that may be arranged on one or more different semiconductor dies. In some embodiments, the semiconductor device 10 of FIG. 1 may be used as the individual semiconductor devices 204 of the semiconductor memory 200.

The semiconductor memory 200 may include a package that contains and interconnects the various individual semiconductor devices 204. The package may provide a plurality of external pins that couple to contact pads arranged on the interior of the package. The pins and pads may provide electrical connections such as between the semiconductor devices 204 and the larger system to which the semiconductor memory 200 is coupled. As shown in FIG. 2A, the semiconductor memory 200 may include an internal pad, which may be referred to as the ZQ pad 112. An external resistance RZQ may couple to the ZQ pad 112.

One or more of the individual semiconductor devices 204 are coupled to the ZQ pad 112 to share the external resistance RZQ for impedance calibration. Each of the semiconductor devices 204 may be coupled to the ZQ pad 112 at a respective calibration terminal ZQ 27. As previously described, where several semiconductor devices 204 have respective calibration terminals ZQ 27 sharing an external resistance RZQ, the semiconductor devices 204 need to arbitrate for use of the external resistance RZQ during calibrations operations and obtain control over the external resistance RZQ before initiating calibration operations.

The semiconductor memory 200 may be associated with one or more memory controllers 240 that are configured to provide data communication to and from the semiconductor memory 200. Each memory controller 240 may communicate across a separate memory bus 252 that couples the memory controller 240 to one or more individual semiconductor devices 204 of the semiconductor memory 200. Each memory bus 252 associated with a given memory controller 240 may include address, data, and control lines that are connected in common between the various semiconductor devices 204 with which the respective memory controller 240 communicates. Each memory bus 252 may additionally include individual chip select lines 256 that may be selectively asserted to enable one of the semiconductor devices 204 to send or receive data across the common address, data, and control lines. Through the combination of individual chip select lines 256 and common address, data, and control lines, a memory bus 252 associated with a given memory controller 240 provides separate communication pathways between the memory controller and each of the various semiconductor devices 204 with which the memory controller 240 communicates.

As will be described in more detail below, the calibration circuit 38 is configured to arbitrate and perform ZQ calibration operations and maintain calibration parameters in the background. That is, the calibration circuit 38 may perform ZQ calibration operations and maintain calibration parameters without receiving a calibration command, for example, from a memory controller. In this manner, calibration operations can be performed and the calibration parameters maintained by the semiconductor device 10 without waiting for a calibration command.

Calibration operations may be performed as part of a power-on sequence that occurs when power is first provided to the semiconductor device 10. Calibration operations may also be performed by the calibration circuit 38 when there is a change in operating condition for the semiconductor device 10. For example, calibration operations may be performed by the calibration circuit 38 based on the operating temperature of the semiconductor device 10, such as a change in the operating temperature may cause calibration operations to be performed, or the operating temperature exceeds or falls below a temperature limit. Calibration operations may also be performed based on time. For example, the calibration circuit 38 may perform calibration operations after a time period has elapsed. The calibration circuit 38 may perform calibration operations periodically as another example.

The calibration circuit 38 may provide an indication of completing calibration operations or determining new calibration parameters by updating information in the mode registers 125. For example, in some embodiments, the calibration circuit 38 updates a bit stored in the mode registers 125. The mode registers 125 may be queried, for example, by a memory controller, to retrieve the updated bit reflecting the completion of the calibration operations. The calibration circuit 38 may additionally or alternatively update information in the mode registers 125 to provide indication of updated calibration parameters. The calibration parameters may be changed (e.g., updated) following a calibration operation triggered by the calibration circuit 38, such as previously discussed.

Figure 2B:
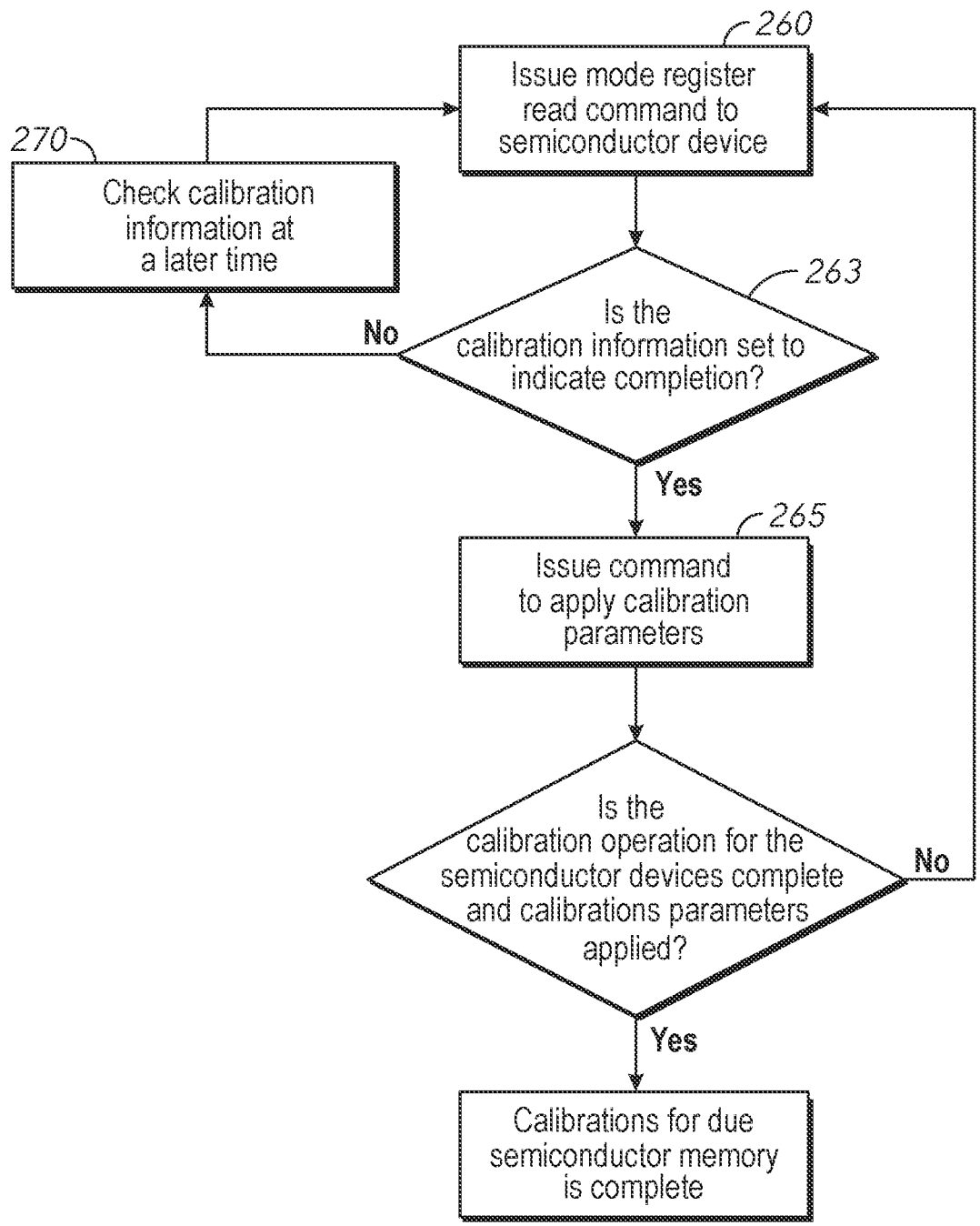
FIG. 2B is a flow diagram for calibrating impedances of the semiconductor memory of FIG. 2A according to an embodiment of the disclosure.

In operation, with reference to FIG. 2B, a memory controller 240 may issue a mode register read command at step 260 to a semiconductor device 204 to which the memory controller is coupled to read calibration information from the mode register. At step 263, if the read calibration information is set to indicate that the calibration operation is completed and/or new calibration parameters have been determined, at step 265 the memory controller 240 may issue a command to apply the calibration parameters to set impedances of the programmable termination components for that semiconductor device. Where calibration parameters are applied without the need to receive a command, the memory controller 240 does not issue a specific command, step 265 may be omitted. If the calibration information is not set to indicate such, the memory controller 240 may check the calibration information at a later time, as represented by step 270. Until that later time, the memory controller 240 may perform other operations, for example, other operations related to power up and initialization.

The operation of checking the calibration information of the semiconductor devices 204 may be repeated by the memory controllers 240 until the semiconductor devices 204 are all calibrated. After all of the semiconductor devices 204 have calibration information indicating that the calibration operation is completed, and the calibration parameters have been applied, calibration operations for the semiconductor memory 200 is complete.

Figure 3:
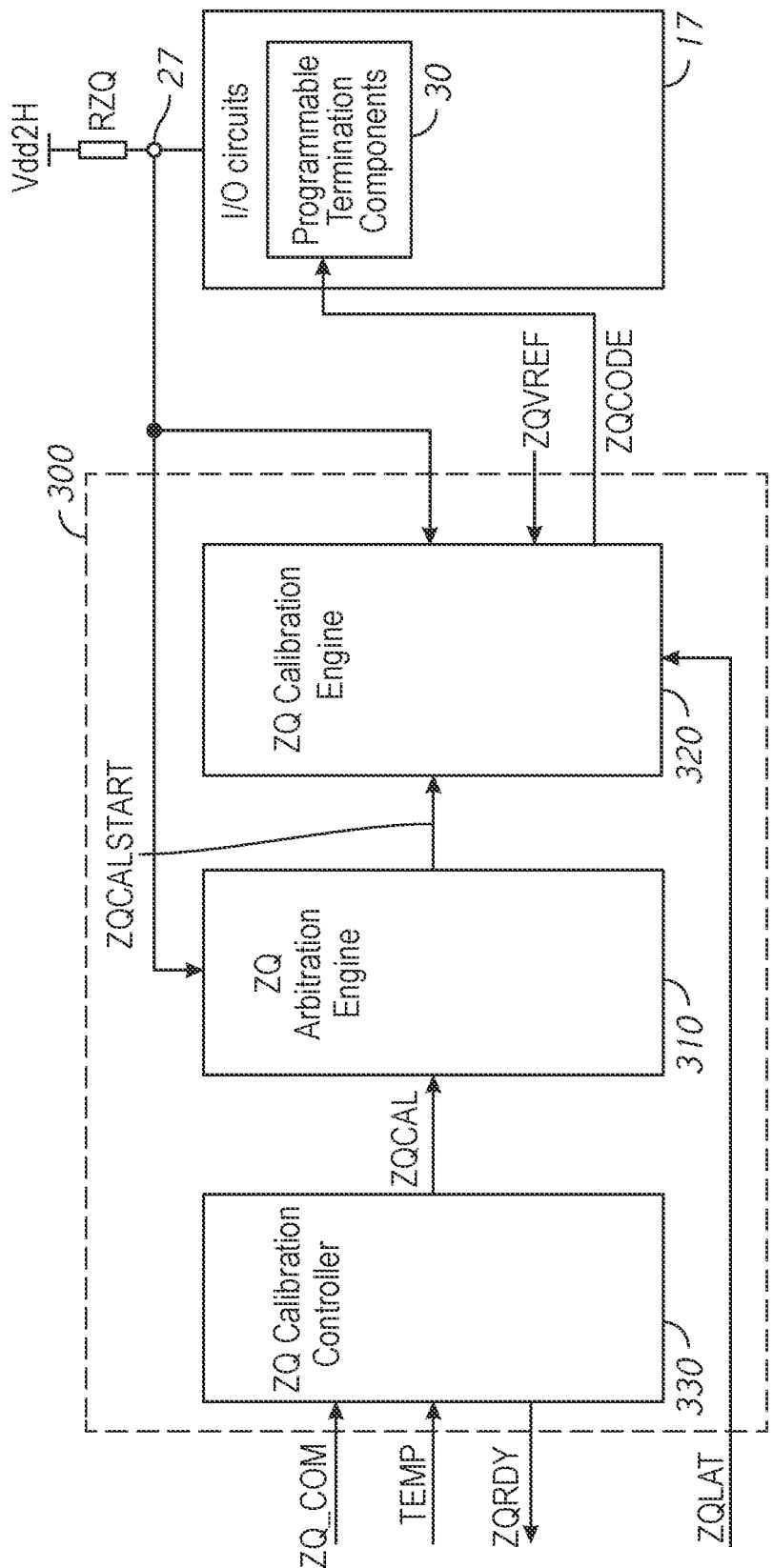
FIG. 3 is a block diagram of an impedance calibration circuit according to an embodiment of the disclosure.

FIG. 3 is a block diagram of an impedance ZQ calibration circuit 300 according to an embodiment of the disclosure. The calibration circuit 300 may be used as the ZQ calibration circuit 38 (FIG. 1) in some embodiments. The ZQ calibration circuit 300 may perform calibration operations without receiving a calibration command, for example, from a memory controller. The calibrations operations occur in the background, and completion or updating with new calibration parameters is indicated by calibration information programmed in a mode register.

The calibration circuit 300 is coupled to the calibration terminal ZQ 27. An external resistance RZQ is coupled between the calibration terminal ZQ 27 and a power supply. The power supply may provide a voltage, for example, that is equal to the internal voltage Vdd2H. In some embodiments, the internal voltage Vdd2H is a constant voltage, and does not vary based on variations in an externally provided voltage, for example, the externally provided data output voltage VDDQ or the power supply voltage VDD. However, as previously described, in some embodiments of the disclosure, the power supply may provide a voltage that is equal to the VDDQ voltage, or another voltage.

The calibration circuit 300 includes a ZQ arbitration engine 310 coupled to the calibration terminal ZQ 27 and receives a calibration activation signal ZQCAL. As previously discussed, the calibration circuit 300 performs calibration operations when activated by the calibration signal ZQ_COM. The ZQ arbitration engine 310 is configured to arbitrate for control over the external resistance RZQ amongst multiple semiconductor devices that are coupled to the same external resistance RZQ. In response to the calibration activation signal ZQCAL, the ZQ arbitration engine 310 provides a calibration start signal ZQCALSTART to initiate calibration operations when control over the external resistance RZQ is obtained.

In some embodiments, the ZQ arbitration engine 310 may apply a protocol priority arbitration scheme with other semiconductor devices coupled to a shared external resistance RZQ. In determining whether other semiconductor devices are performing calibration operations using the external resistance RZQ, the ZQ arbitration engine 310 may monitor a voltage of the calibration terminal ZQ 27 and compare the voltage to an expected threshold voltage. The arbitration engine 310 may monitor the voltage of the calibration terminal ZQ 27 over a time interval associated with the semiconductor device to avoid contention over use of the external resistance RZQ. Each of the semiconductor devices coupled to the external resistance RZQ may have a different time interval.

While examples of arbitration protocols have been described, they are not intended to limit the disclosure to only these examples arbitration protocols. Other arbitration protocols may be used as well without departing from the scope of the present disclosure.

The ZQ calibration engine 320 is coupled to the arbitration engine 310 and the calibration terminal ZQ 27. The ZQ calibration engine 320 is configured to perform the calibration operation and provide calibration parameters for setting impedances of programmable termination components. The ZQ calibration engine 320 performs calibration operations when activated by the calibration start signal ZQCAL-START. The ZQ calibration engine 320 uses a voltage of the calibration terminal ZQ 27 for determining the calibration parameters. The calibration parameters may be stored, and the ZQ calibration engine 320 may apply the calibration parameters to set impedances of the programmable termination components responsive to the ZQLAT signal. The ZQLAT signal is based on a ZQ Latch command received by the semiconductor device. The calibration parameters are provided in the form of an impedance code ZQCODE. The impedance code ZQCODE is provided to the input/output circuit 17 and applied to set the impedances of programmable termination components included in the input/output circuit 17.

The calibration circuit further includes a ZQ calibration controller 330. The ZQ calibration controller 330 receives the calibration signal ZQ_COM and is coupled to the ZQ arbitration engine 310. The calibration controller 330 provides the calibration activation signal ZQCAL to the ZQ arbitration engine 310 to initiate calibration operations when control over the external resistance RZQ is obtained.

The ZQ calibration controller 330 may further receive temperature information provided by the temperature sensor 44. The temperature information may be represented by the TEMP signal. As will be described in more detail below, the calibration controller 330 may provide a calibration activation signal ZQCAL to initiate calibration operations based on the temperature information. For example, in some embodiments, the calibration controller 330 may initiate a calibration operation responsive to a change in temperature exceeding a temperature range. In this manner, accurate calibration parameters may be maintained over changing operating temperature.

The ZQ calibration controller 330 may initiate calibration operations based on time. The ZQ calibration controller 330 may receive a clock signal, for example, the internal clock signal LCLK provided by the internal clock generator 36 of FIG. 1. The ZQ calibration controller 330 may use the clock signal to time when a calibration activation signal ZQCAL is provided to initiate the calibration operations. For example, the ZQ calibration controller 330 may provide the calibration activation signal ZQCAL to periodically perform the calibration operations. A time period may be measured according to the clock signal, and the calibration activation signal ZQCAL provided when the time period elapses. In this manner, accurate calibration parameters may be maintained over time.

Figure 4:
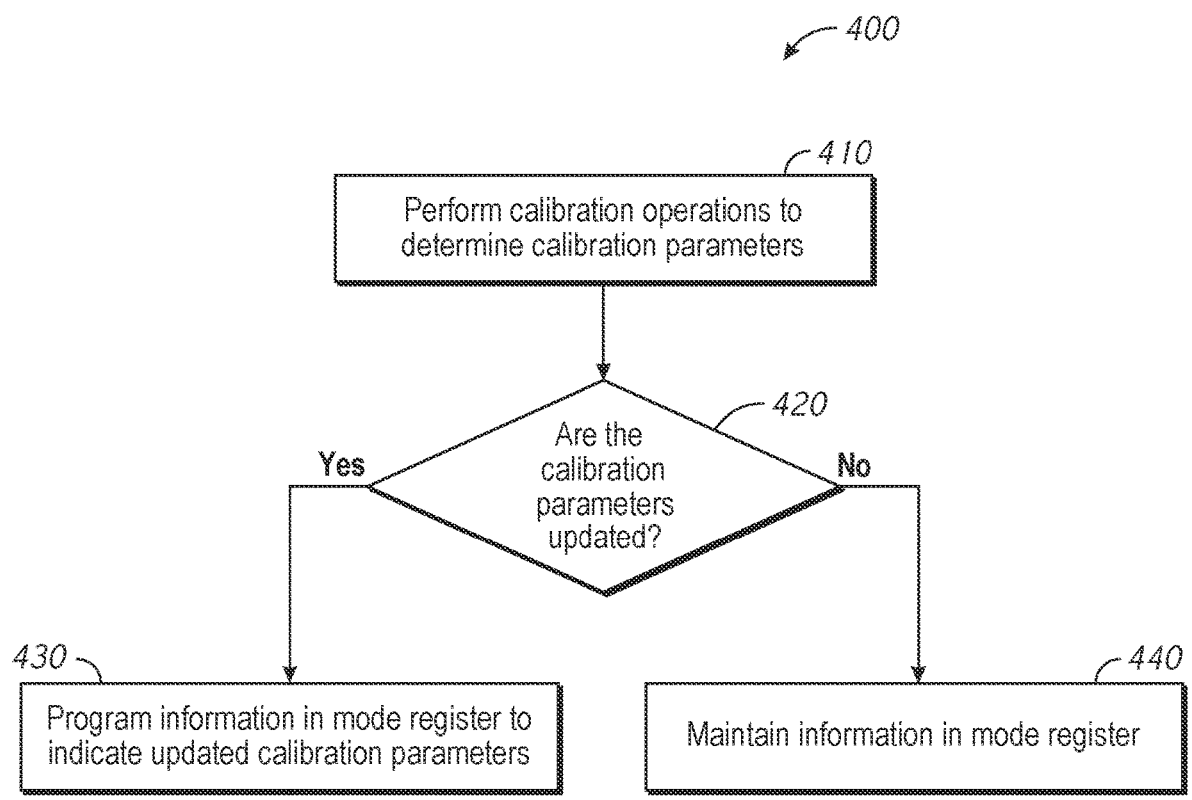
FIG. 4 is a flow diagram of an operation according to an embodiment of the disclosure for a calibration circuit.

FIG. 4 is a flow diagram 400 of an operation of the calibration circuit 300 according to an embodiment of the disclosure. A calibration operation is performed at step 410 to determine the calibration parameters for the programmable termination components 30 of the I/O circuit 17. In the event that the calibration parameters are updated with new calibration parameters (e.g., to change the settings of the programmable termination components 30) at step 420, information is programmed in the mode register at step 430 to indicate that the calibration parameters have been updated (e.g., program "1" in the mode register). However, in the event that the calibration parameters are not updated with new calibration parameters (e.g., maintain current settings of the programmable termination components 30) at step 420, the information in the mode register providing notification/indication of the calibration operation is maintained at step 440 (e.g., maintain "0" in the mode register).

Figure 5:
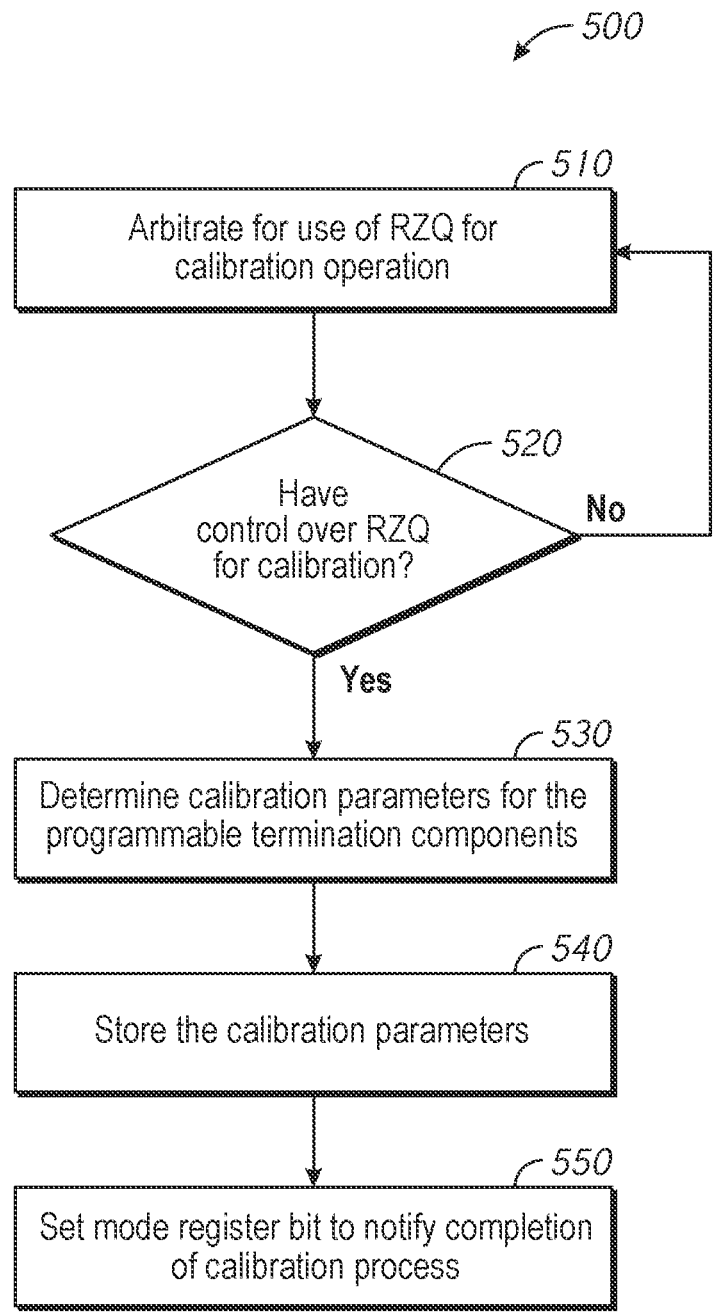
FIG. 5 is a flow diagram of a calibration operation according to an embodiment of the disclosure.

FIG. 5 is a flow diagram of a calibration operation 500 according to an embodiment of the disclosure. The calibration operation 500 may be performed by a calibration circuit, for example, the calibration circuit 38 of FIG. 1, the calibration circuit 300 of FIG. 3, or another calibration circuit in accordance with an embodiment of the disclosure.

In some embodiments, the calibration operation 500 may be initiated by a calibration circuit as part of a power up operation. In some embodiments, the calibration operation 500 may be initiated responsive to a calibration command. A calibration command may be provided, for example, by a memory controller to a semiconductor device including a calibration circuit. In some embodiments, the calibration operation 500 may be initiated by a calibration circuit based on temperature, such as temperature measured by a temperature sensor 44 of FIG. 1. For example, the calibration circuit may initiate the calibration operation 500 when the measured temperature exceeds a temperature limit. In another example, the calibration circuit may initiate the calibration operation 500 when a temperature difference between a current temperature and a previous temperature exceeds a temperature range. In some embodiments, the calibration operation 500 may be initiated by a calibration circuit based on time. For example, the calibration circuit may initiate the calibration operation 500 periodically, or after a time period has elapsed. The time period may be measured based on a clock signal.

A calibration circuit may perform step 510 when a plurality of semiconductor devices are coupled to the same external resistance RZQ. One semiconductor device may use the external resistance RZQ at a time for calibration operations. To avoid more than one semiconductor device using the external resistance RZQ at a time, a ZQ arbitration engine of the calibration circuit may arbitrate usage of the external resistance RZQ by the semiconductor device to avoid conflicts with other semiconductor devices using the external resistance RZQ at the same time.

At step 520 a decision is made by the calibration circuit whether the semiconductor device has control over the external resistance RZQ to use for the calibration operation. The calibration circuit remains at step 520 until the semiconductor device has obtained control over the external resistance RZQ to perform the calibration operation. When the semiconductor device has control over the external resistance RZQ, the calibration circuit performs the calibration operation at step 530. The steps 510 and 520 may be excluded from the calibration operation 500 in some embodiments. For example, where concurrent usage of the external resistance RZQ by multiple semiconductor devices is avoided by some other technique, the steps 510 and 520 may be excluded.

At step 530 the calibration parameters may be determined by the calibration circuit based on the external resistance RZQ. The calibration parameters may be determined by the ZQ calibration engine. In some embodiments, the ZQ calibration engine determines the calibration parameters by an operation that includes comparing the voltage at the calibration terminal ZQ 27 to a reference voltage and adjusting programmable termination components until the voltage at the calibration terminal ZQ is equal to the reference voltage ZQVREF. The calibration parameters are then stored by the calibration circuit at step 540 and an indication of completing the calibration operation is provided by programming information to a mode register at step 550. The mode register may be queried through a mode register read operation, for example, by a memory controller. In some embodiments, a calibration latch command may be received by the semiconductor device 10 to apply any new calibration parameters. In some embodiments, the new calibration parameters may be applied without a calibration latch command. For example, after a change in the frequency set point any new calibration parameters may be applied without receiving a calibration latch command from a memory controller.

Figure 6:
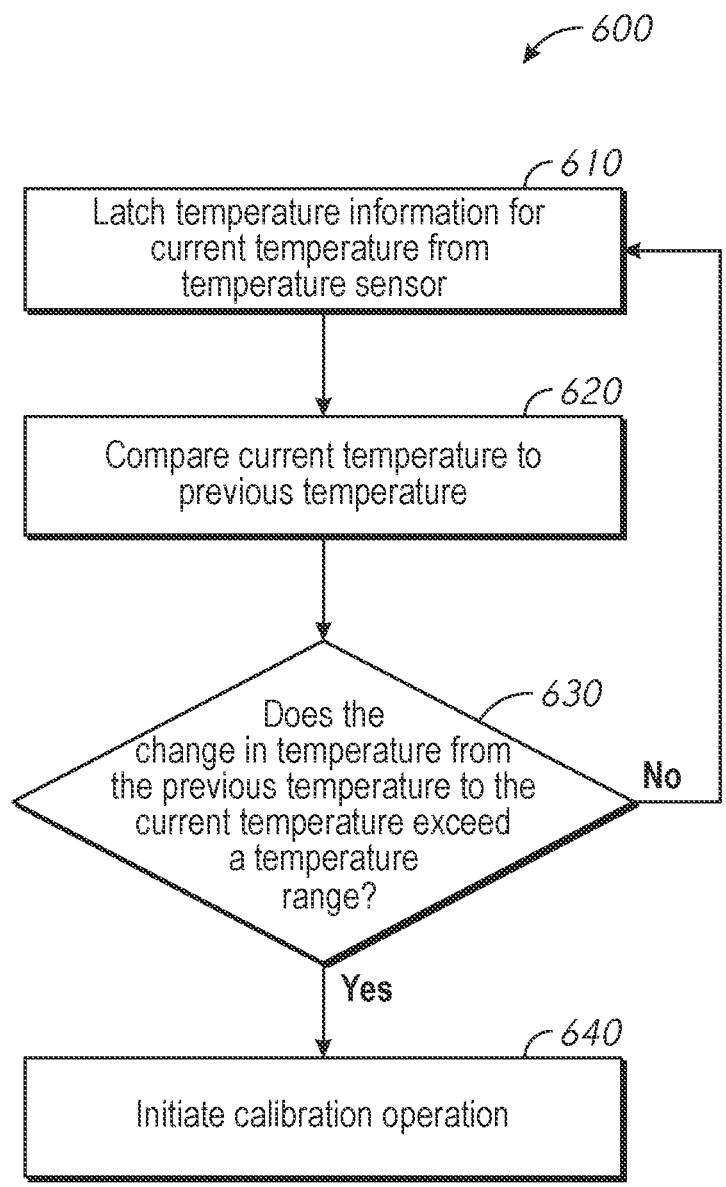
FIG. 6 is a flow diagram of calibration initiation operation for initiating a calibration operation based on temperature according to an embodiment of the disclosure.

FIG. 6 is a flow diagram of calibration initiation operation 600 for initiating a calibration operation based on temperature according to an embodiment of the disclosure. The calibration initiation operation 600 may be performed by a calibration circuit, for example, the calibration circuit 38 of FIG. 1, the calibration circuit 300 of FIG. 3, or another calibration circuit in accordance with an embodiment of the disclosure.

At step 610, temperature information representing a current temperature may be latched by the calibration circuit. Temperature information may be provided to the calibration circuit by a temperature sensor, for example, temperature sensor 44 of FIG. 1. As previously described, the temperature sensor senses a temperature of the semiconductor device and provides temperature information. The temperature information may be represented by a signal that is indicative of a temperature of the semiconductor device. For example, in some embodiments the signal represents digital data that may be latched by the calibration circuit. In some embodiments a voltage level of the signal may become higher if the temperature of the semiconductor device becomes higher, and conversely, may become lower if the temperature of the semiconductor device becomes lower. The voltage of the signal may be converted into a digital value that may then be latched by the calibration circuit.

At step 620, the current temperature is compared to a previous temperature by the calibration circuit to determine a change in temperature. When the change in temperature exceeds a temperature range, a calibration operation may be initiated. At step 630 the decision is made whether the change in temperature exceeds the temperature range. If the change in temperature does not exceed the temperature range, new temperature information is latched for comparison at step 610. In this way, the change in temperature as measured by the temperature sensor may be monitored by the calibration circuit until the change in temperature exceeds the temperature range. If the change in temperature does exceed the temperature range, a calibration operation is initiated by the calibration circuit at step 640. The calibration operation 500 of FIG. 5 may be used by the calibration operation at step 640 in some embodiments.

The temperature range against which the temperature change is evaluated may be programmable by programming information in a mode register in some embodiments. For example, programming first information to the mode register may program a first temperature range to evaluate the temperature change, whereas programming second information to the mode register may program a second temperature range to evaluate the temperature change.

Figure 7:
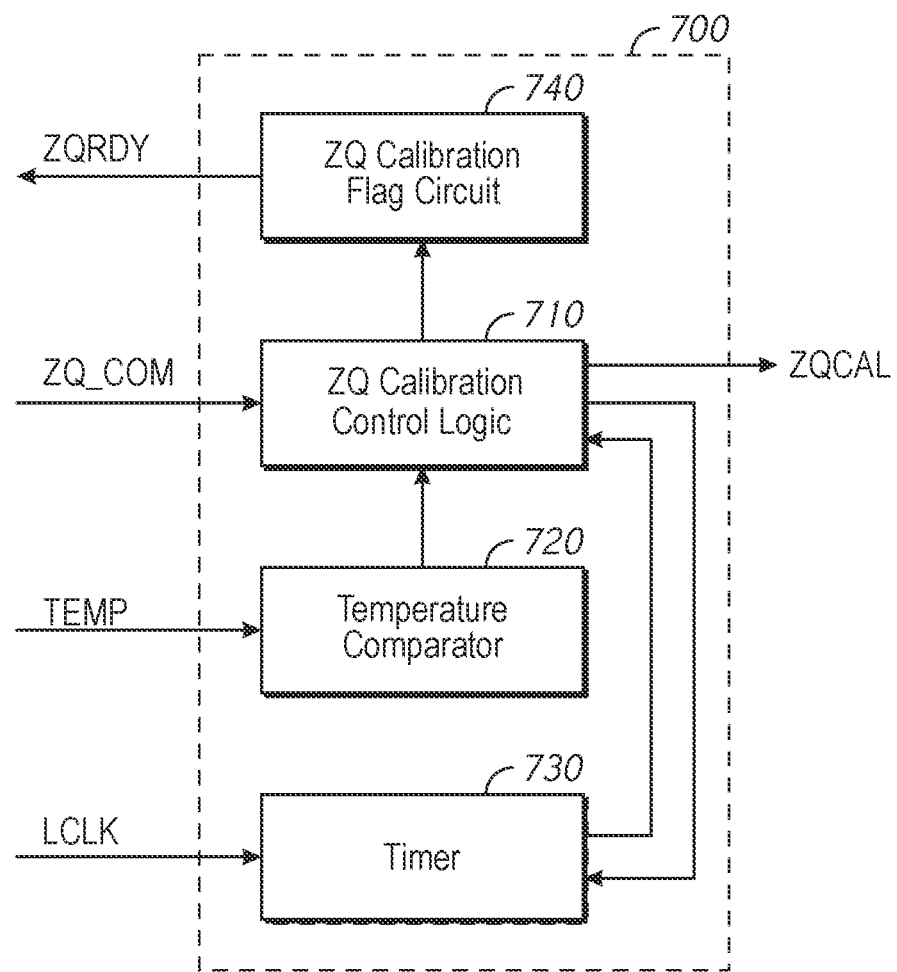
FIG. 7 is a block diagram of an impedance calibration controller according to an embodiment of the disclosure.

FIG. 7 is a block diagram of an impedance ZQ calibration controller 700 according to an embodiment of the disclosure. The ZQ calibration controller 700 may be used for the ZQ calibration controller 330. The ZQ calibration controller 700 includes ZQ calibration control logic 710 that receives the calibration signal ZQ_COM. As previously described, the calibration signal ZQ_COM is used to activate the calibration circuit to perform calibration operations. The ZQ calibration control logic 710 provides the calibration activation signal ZQCAL to initiate a calibration operation. The calibration activation signal ZQCAL may be provided, for example, to a ZQ arbitration engine to begin arbitration for control of an external resistance RZQ before performing the calibration operation.

The ZQ calibration controller 700 may further include a temperature comparator 720. The temperature comparator 720 may receive temperature information TEMP and may be compared by the temperature comparator 720 to determine whether the ZQ calibration control logic 710 should initiate a calibration operation by providing the calibration activation signal ZQCAL. For example, the temperature information TEMP may be latched and compared by the temperature comparator 720 to temperature information for a previous temperature to determine whether a change in temperature exceeds a temperature range. Where the change in temperature exceeds the temperature range, the ZQ calibration control logic 710 provides a calibration activation signal ZQCAL to initiate a calibration operation. In some embodiments, the temperature comparator 720 compares the temperature information TEMP to temperature limits, and when the temperature limits are exceeded, the ZQ calibration control logic 710 initiates a calibration operation.

The ZQ calibration controller 700 may include a timer 730. The timer 730 receives an internal clock signal LCLK. The timer 730 may be used to cause the ZQ calibration control logic 710 to provide the calibration activation signal ZQCAL to initiate a calibration operation based on time. The timer 730 may use the internal clock signal LCLK to time when to initiate calibration operations. For example, the timer 730 may be used to cause the ZQ calibration control logic 710 to periodically initiate calibration operations. The timer 730 may measure a time period according to the internal clock signal LCLK so that the ZQ calibration control logic 710 provides the calibration activation signal ZQCAL when the time period elapses.

The ZQ calibration controller 700 may also include a ZQ calibration flag circuit 740. The ZQ calibration flag circuit 740 is configured to program information into a mode register (e.g., mode register 125 of FIG. 1) to provide an indication related to the calibration operation. In the embodiment of FIG. 7, the calibration information programmed in the mode register is represented by calibration information ZQRDY. The calibration information may be represented by a single bit of data programmed in the mode register. The ZQ calibration flag circuit 740 is configured to program the calibration information ZQRDY in the mode register having a value that reflects an aspect of the calibration operation. For example, in some embodiments the value of the calibration information ZQRDY programmed in the mode register represents whether the calibration operation is completed. A "0" value may indicate that the calibration operation has not completed and a "1" value may indicate that the calibration operation has completed. In some embodiments the value of the calibration information ZQRDY represents whether any new calibration parameters have been determined by a ZQ calibration engine. A "0" value indicates that a calibration operation did not result in new calibration parameters, and a "1" value may indicate that there are new calibration parameters.

The calibration information programmed in the mode register has been described as a bit of data, that is, calibration information ZQRDY represented by one bit of data. However, in some embodiments, additional bits may be included as part of the information programmed in the mode register. For example, two or more bits may be programmed in the mode register, with each bit providing indication of different aspects of the calibration operation.

The mode register may be read by a mode register read command received by the semiconductor device 10. The calibration information ZQRDY will be provided in response to the mode register read, thereby providing the indication of the calibration operation. The mode register read command may be used by a memory controller to query the semiconductor device 10 regarding the status of a calibration operation. In response to the mode register read command, information programmed in the mode register, including the calibration information ZQRDY, is provided by the semiconductor device 10 to the memory controller. Upon determining that the calibration information ZQRDY is set (e.g., to indicate that the calibration operation is complete, to indicate new calibration parameters, etc.), the memory controller may provide a ZQ latch command to the semiconductor device to apply the calibration parameters to set impedances of the programmable termination components in some embodiments. The semiconductor device 10 applies the calibration parameters to set the impedances in response to the ZQ latch command. In some embodiments, the calibration parameters may be applied to set the impedances without receiving a command, for example, the calibration parameters are automatically applied by the semiconductor device following completion of the calibration operations.

The ZQ calibration controller 700 is illustrated in FIG. 7 as including the ZQ calibration control logic 710, the temperature comparator 720, timer 730, and ZQ calibration flag circuit 740. However, the embodiment illustrated in FIG. 7 is not intended to limit the configuration of the ZQ calibration controller 700. In other embodiments of the invention, one or more of the ZQ calibration control logic 710, the temperature comparator 720, timer 730, and ZQ calibration flag circuit 740 may be located elsewhere in the semiconductor device and/or implemented using other circuits included in the semiconductor device.

Figure 8:
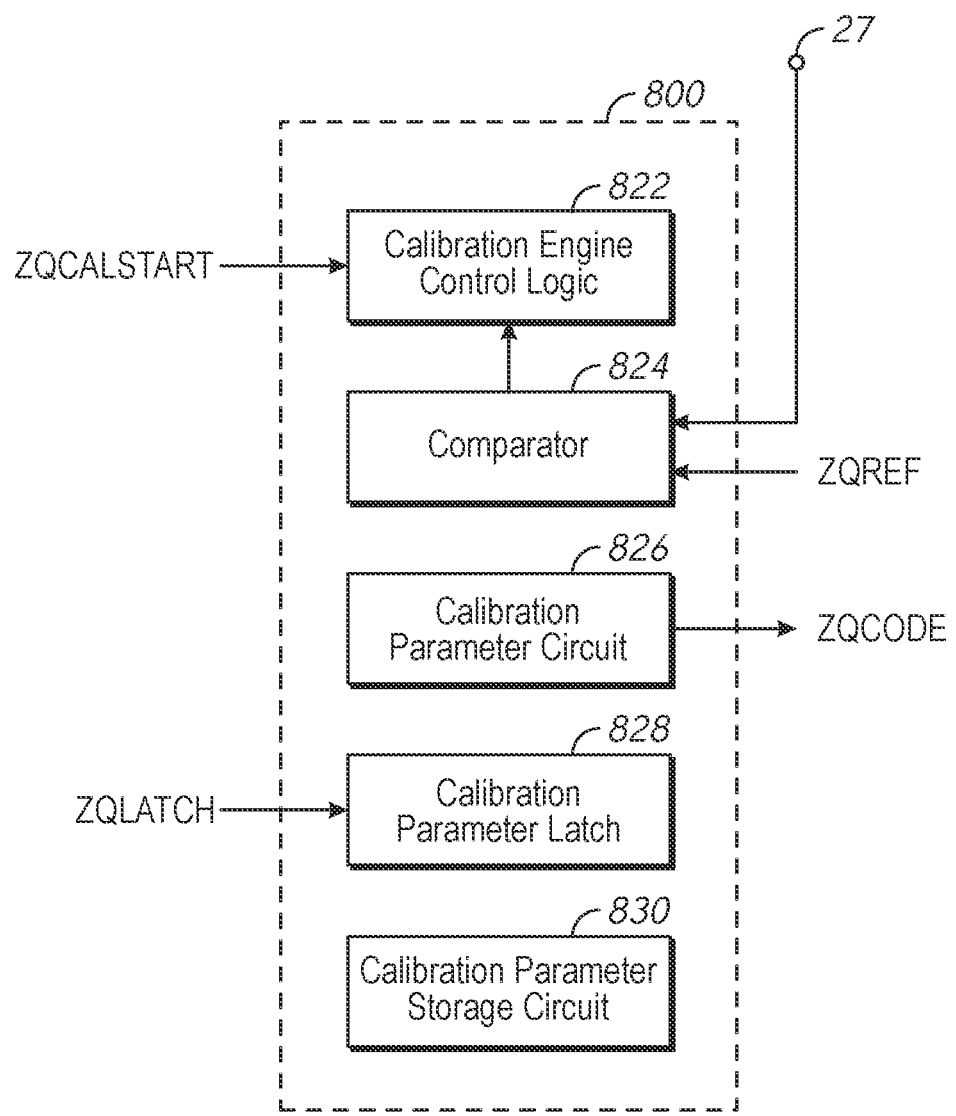
FIG. 8 is a block diagram of an impedance calibration engine according to an embodiment of the disclosure.

FIG. 8 is a block diagram of an impedance ZQ calibration engine 800 according to an embodiment of the disclosure. The ZQ calibration engine 800 includes calibration engine control logic 822 that receives a calibration start signal ZQCALSTART to activate the ZQ calibration engine 800 to perform calibration operations. A comparator 824 included in the ZQ calibration engine 800 is coupled to the calibration terminal ZQ 27 and is further provided the reference voltage ZQVREF. The comparator 824 compares the voltage at the calibration terminal ZQ 27 with the reference voltage ZQVREF. The reference voltage ZQVREF may be based on another voltage. For example, in some embodiments, the reference voltage ZQVREF may be based on an externally provided data output voltage VDDQ. In some embodiments, the reference voltage ZQVREF may be based on an internal voltage. For example, the reference voltage ZQVREF may be based on Vdd2H, which as previously described, may be a constant voltage and does not vary based on variations in an externally provided voltage, for example, the externally provided data output voltage VDDQ. Vdd2H may be 1.05 volts in some embodiments. In some embodiments, however, Vdd2H may be 1.1 volts. The reference voltage ZQVREF may be a fraction of Vdd2H. In some embodiments, the reference voltage ZQVREF may be one-fourth of Vdd2H. In some embodiments, the reference voltage ZQVREF may be one-half of Vdd2H. The specific examples for the reference voltage ZQVREF described are not intended to limit the reference voltage ZQVREF to those examples. Other values for the reference voltage ZQVREF may be used as well.

The comparator 824 provides a signal to a calibration parameter circuit 826. The calibration parameter circuit 826 determines calibration parameters that are used to adjust the impedance of programmable termination components. The calibration parameter circuit 826 determines the calibration parameters by changing the calibration parameters until comparator 824 indicates that the voltage at the calibration terminal ZQ 27 is equal to the reference voltage ZQVREF. When the comparator 824 indicates the voltages are equal, the calibration parameters are provided to a calibration parameter latch 828. The calibration parameter latch 828 latches the calibration parameters, and the calibration parameters are applied to set impedances of programmable termination components in response to the ZQ latch signal ZQLAT.

The ZQ calibration engine 800 further includes a calibration parameter storage circuit 830. The calibration parameter storage circuit 830 is configured to store calibration parameters. Calibration parameters for various operating conditions may be stored by the calibration storage circuit 830. For example, calibration parameters for multiple frequency set points may be stored after the calibration parameters are determined by the calibration parameter circuit 826. The calibration parameters may be kept current by background calibration operations. The current calibration parameters may be stored to update previous calibration parameters. Storing calibration parameters in the calibration storage circuit 830 may avoid performing a calibration operation when changing operating conditions, for example, changing frequency set points.

Figure 9:
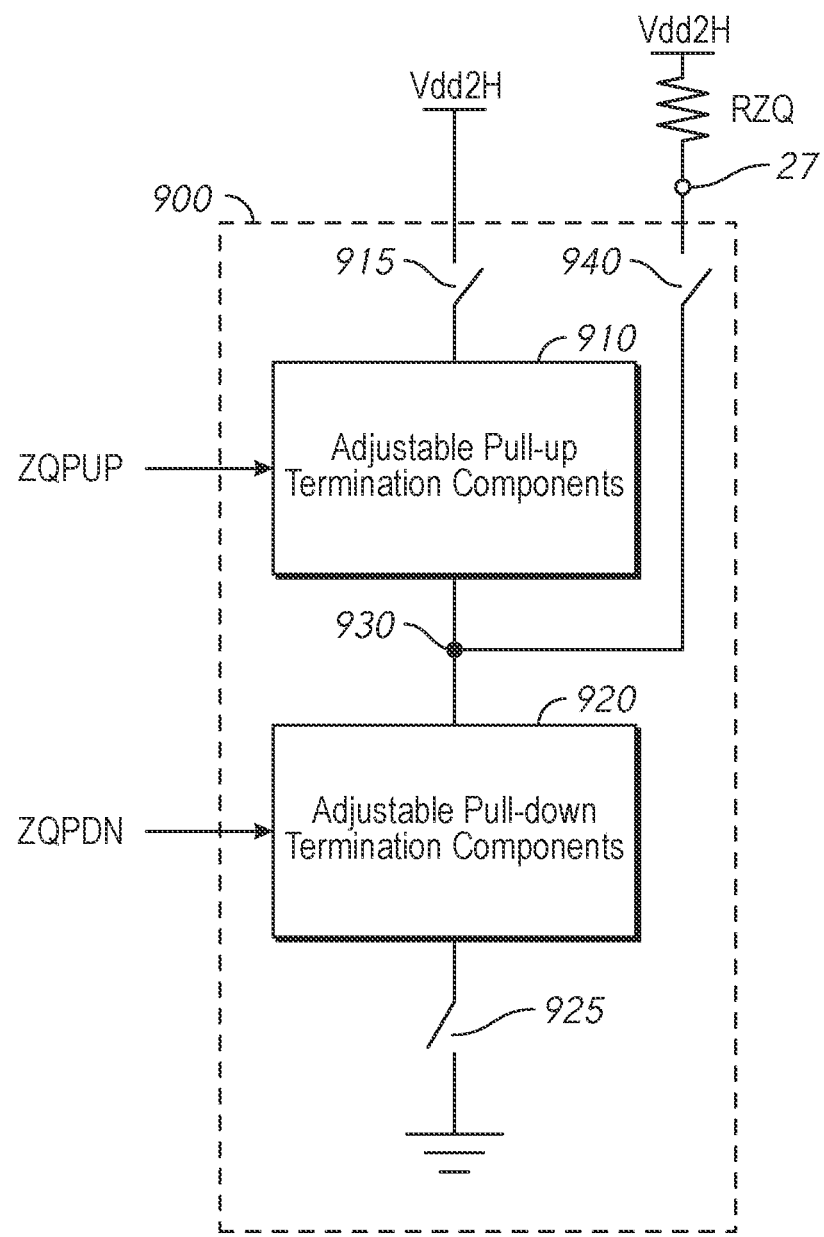
FIG. 9 is a block diagram of programmable termination components according to an embodiment of the disclosure.

FIG. 9 is a block diagram of programmable termination components 900 according to an embodiment of the disclosure. The programmable termination components 900 may be used setting pull-up and pull-down impedances for the programmable termination components 30 of the I/O circuits 17. In some embodiments, the programmable termination components 900 is a replica of programmable termination components that are used for on-die termination and output buffer impedance. In such embodiments where the programmable termination components 900 is a replica, the programmable termination components 900 are used to determine an impedance code ZQCODE, which is then used to set the impedances of the actual programmable termination components used for on-die termination and output buffer impedance.

The programmable termination components 900 include adjustable pull-up termination components 910 and adjustable pull-down termination components 920. The adjustable pull-up termination components 910 and adjustable pull-down termination components 920 are coupled to a node 930. The node 930 may be coupled to the calibration terminal 27 through switch 940. A pull-up impedance of the pull-up termination components 910 may be adjusted according to pull-up calibration parameters ZQPUP and a pull-down impedance of the pull-down termination components 920 may be adjusted according to pull-down calibration parameters ZQPDN. The pull-up and pull-down calibration parameters ZQPUP and ZQPDN may be included in the calibration parameters ZQCODE provided by the ZQ calibration engine 320.

In some embodiments, the adjustable pull-up termination components 910 may include a plurality of similar pull-up termination circuits coupled in parallel between the node 930 and a power supply. Each of the pull-up termination circuits includes a resistor and P-channel devices coupled in parallel with the resistor to reduce the impedance of the pull-up termination circuit to tune the impedance of the resistor. The pull-up calibration code ZQPUP may be provided to the control terminals of the P-channel devices to adjust the impedance of the pull-up termination circuits. The adjustable pull-down termination components 920 is similar to the adjustable pull-up termination components 910. Each of the pull-down termination circuits of the adjustable pull-down termination components 920 includes multiple N-channel devices coupled in parallel with a resistor, and the impedance of the pull-down termination circuits are adjustable by the pull-down calibration parameters ZQPDN. Other configurations of adjustable pull-up and pull-down termination components may be used in other embodiments of the disclosure, and the example provided is not intended to limit the scope of the disclosure to any particular configuration of adjustable pull-up and pull-down termination components The pull-up termination components 910 may be coupled to a power supply (e.g., Vdd2H) through a switch 915. The switch 915 may be used to activate the pull-up termination components 910. The pull-down termination components 920 may be coupled to ground through a switch 925. The switch 925 may be used to activate the pull-down termination components 920. The switches 915 and 925 may be controlled by the calibration engine control logic 822 during calibration operations.

A calibration operation according to an embodiment of the disclosure will described below. The calibration operation maybe performed by the ZQ calibration circuit. The calibration operation will be described with reference to FIGS. 1-9. It will be appreciated that the following calibration operation is provided by way of example and is not intended to limit the disclosure to the specific calibration operation described. The ZQ calibration engine control logic 822 is activated by the calibration start signal ZQCALSTART to perform the calibration operation. The calibration operation may include determining calibration parameters to set a pull-down impedance of the programmable termination components and also determining calibration parameters to set a pull-up impedance of the programmable termination components.

When the calibration engine control logic 822 is activated by the calibration start signal ZQCALSTART, the comparator 824 compares a voltage at the calibration terminal ZQ 27 with the reference voltage ZQVREF to determine the calibration parameters to set a pull-down impedance. The voltage at the calibration terminal ZQ 27 is based on an impedance of programmable termination components set by current calibration parameters and the external resistance RZQ. As previously described, the calibration terminal ZQ 27 is coupled to an external resistance RZQ. The external resistance RZQ forms a voltage divider circuit with the pull-down impedance of the programmable termination components, and thus, the voltage of the calibration terminal ZQ 27 is a fraction of the Vdd2H voltage based on the ratio of the impedances of the external resistance RZQ and the pull-down impedance of the programmable termination components. As the pull-down impedance of the programmable termination components increases, the voltage of the calibration terminal ZQ 27 increases. Conversely, as the pull-down impedance of the programmable termination components decreases the voltage of the calibration terminal ZQ 27 decreases.

The pull-down impedance of the programmable termination components is adjusted by the calibration parameter circuit 826 by changing the calibration parameters setting the pull-down impedance until the comparator 824 indicates that the voltage of the calibration terminal ZQ 27 is equal to the reference voltage ZQVREF. When the voltage of the calibration terminal ZQ 27 is equal to the reference voltage ZQVREF, the pull-down impedance of the programmable termination components has been set to the correct pull-down impedance. The calibration parameters provided by the calibration parameter circuit 826 that set the correct impedance or the pull-down impedance of the programmable termination components are latched by the calibration parameter latch 828.

With the correct pull-down impedance of the adjustable pull-down termination components set, the calibration parameters to set the pull-up impedance of the adjustable pull-up termination components may be determined. Instead of the external resistance RZQ being used for the calibration, the calibration terminal ZQ 27 is coupled through the adjustable pull-down termination components to ground (set with the correct pull-down impedance) and further coupled through the adjustable pull-up termination components to the power supply providing the voltage Vdd2H.

The pull-up impedance of the adjustable pull-up termination components is adjusted by the calibration parameter circuit 826 by changing the calibration parameters setting the pull-up impedance until the comparator 824 provides a signal to the calibration parameter circuit 826 that indicates the voltage of the calibration terminal ZQ 27 is equal to the reference voltage ZQVREF. When the voltage of a shared node between the pull-up and pull-down termination components (e.g., node 930 of FIG. 9) is equal to the reference voltage ZQVREF, the pull-up impedance of the adjustable pull-up termination components has been set to the correct pull-up impedance. The calibration parameters provided by the calibration parameter circuit 826 that set the correct pull-up impedance of the adjustable pull-up termination components are latched by the calibration parameter latch 828.

Following the calibration operation, the calibration parameters for the pull-down and pull-up impedances have been determined and the calibration parameters for setting the pull-down and pull-up impedances are applied in response to the ZQ latch signal ZQLAT.

As previously described, the reference voltage ZQVREF may be based on an internal voltage, for example, Vdd2H, or an external voltage, such as VDDQ. The internal voltage Vdd2H may be a constant voltage that does not vary based on variations in the externally provided data output voltage VDDQ. Thus, a calibration operation may not need to be performed if the data output voltage VDDQ is changed, for example, when changing a frequency set point for operation.

In some embodiments, calibration operations for determining the calibration parameters for the pull-up impedance for the programmable termination components may be command based. For example, a command may be received by the semiconductor device for performing calibration operations for the pull-up impedance of the programmable termination components, without performing calibration operations for the pull-down impedance. Calibration operations for the pull-impedance do not require the use of the external resistance RZQ, and consequently, arbitration to obtain control over the external resistance RZQ is not necessary. In this manner, the pull-up impedance of the programmable termination components may be updated when changing a frequency set point for operation, which may involve changing the data output voltage VDDQ. Changing the data output voltage VDDQ may involve changing the pull-up impedance without changing the pull-down impedance.

Figure 10:
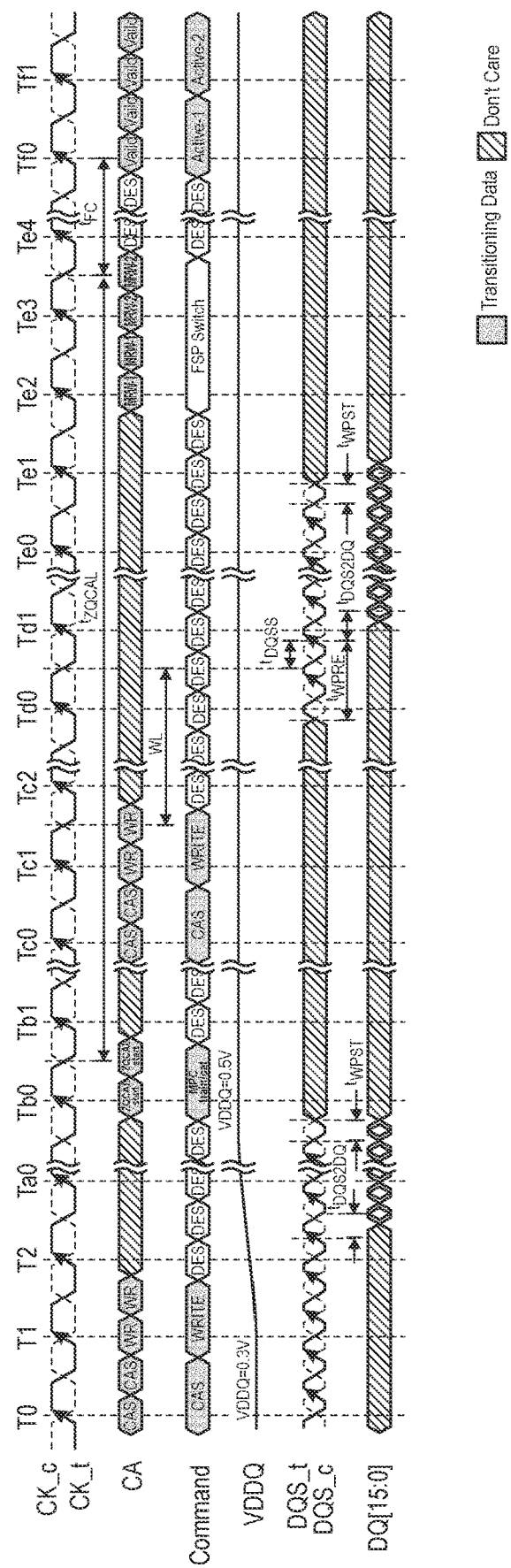
FIG. 10 is a timing diagram of a Voh calibration according to an embodiment of the disclosure.

FIG. 10 is a timing diagram of a Voh calibration according to an embodiment of the disclosure. Voh represents the voltage of a logical high value for output data signals. The timing diagram of FIG. 10 illustrates various signals for changing a frequency set point associated with changing to a higher data output voltage VDDQ. FIG. 10 illustrates a true clock signal CK_t and a complementary clock signal CK_c, along with command-address signals CA and the command represented by the command-address signals CA. FIG. 10 further illustrates the data output voltage VDDQ, true and complementary data strobe signals DQS_t and DQS_c, and the data signals DQ[15:0]. In the embodiment of FIG. 10, the data signals DQ[15:0] include 16 signals. However, the data signals for other embodiments may include greater or fewer signals.

Over times T0 and T1, a write command is received by the semiconductor device 10. Write data is received as data signals DQS[15:0] by the semiconductor device 10 between times T2 and Tb0 in response to the data strobe signals DQS_t and DQS_c. Between times T2 and Tb0, the semiconductor device is deselected, as indicated by DES for the representation of the command. A data strobe to data time tDQS2DQ is illustrated, as is a write strobe pause time tWPST.

At around time T1, the data output voltage VDDQ begins to increase from a first voltage (e.g., 0.3 volts). Although the data output voltage VDDQ begins to change the write operation of the earlier write command may continue. A change in data output voltage VDDQ indicates that a frequency set point for the semiconductor device will be changed. Typically, the data output voltage VDDQ increases for a change to a higher frequency set point, and conversely, the data output voltage VDDQ decreases for a change to a lower frequency set point. By time Tb0 the data output voltage VDDQ has reached a second voltage (e.g., 0.5 volts) that is greater than the first voltage. A calibration command is received at time Tb0 to perform a calibration operation, as represented by the MPC train/cal command. A calibration operation may be needed due to the change in data output voltage VDDQ from the first voltage to the higher second voltage. A ZQ calibration time tZQCAL is measured relative to the calibration command. During the ZQ calibration time tZQCAL the calibration process is performed.

Another write command is received by the semiconductor device over times Tc0 and Tc1, with write data received between times Td1 and Te1 responsive to the data strobe signals DQS_t and DQS_c. A write data preamble time tWPRE and data strobe setup time tDQSS are also illustrated. As illustrated by FIG. 10, a memory operation, for example, a write operation, may be performed during the ZQ calibration time tZQCAL.

Over times Te2 and Te3, mode register write commands are received to cause the frequency set point to change following the end of the ZQ calibration time tZQCAL. In response, the frequency set point for the semiconductor device changes over the frequency change time tFC, and the semiconductor device may be operated according to the new frequency set point following time Tf0. During the frequency change time tFC, the reference voltage Vref may be updated for the new data output voltage VDDQ. In some embodiments, a calibration latch command is needed to be received by the semiconductor device to apply any new calibration parameters to adjust the impedances of the programmable termination components in the input/output circuits 17. In other embodiments, any changes to the calibration parameters are applied without receiving a calibration latch command, for example, responsive to frequency set point change, which eliminates the need for the semiconductor device to receive a calibration latch command to apply the calibration parameters.

Figure 11:
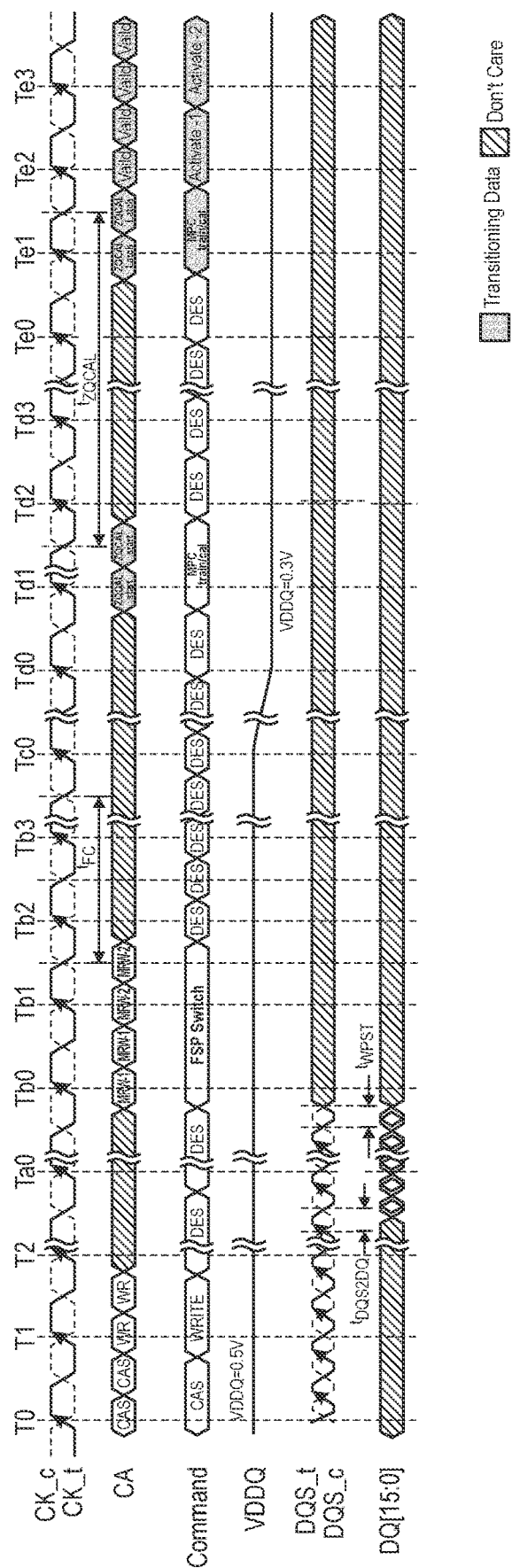
FIG. 11 is a timing diagram of a Voh calibration according to an embodiment of the disclosure.

FIG. 11 is a timing diagram of a Voh calibration according to an embodiment of the disclosure. The timing diagram of FIG. 11 illustrates various signals for changing a frequency set point associated with changing to a lower data output voltage VDDQ. FIG. 11 illustrates a true clock signal CK_t and a complementary clock signal CK_c, along with command-address signals CA and the command represented by the command-address signals CA. FIG. 11 further illustrates the data output voltage VDDQ, true and complementary data strobe signals DQS_t and DQS_c, and the data signals DQ[15:0]. In the embodiment of FIG. 11, the data signals DQ[15:0] include 16 signals. However, the data signals for other embodiments may include greater or fewer signals.

Over times T0 and T1, a write command is received by the semiconductor device 10. Write data is received as data signals DQS[15:0] by the semiconductor device 10 between times T2 and Tb0 in response to the data strobe signals DQS_t and DQS_c. Between times T2 and Tb0, the semiconductor device is deselected, as indicated by DES for the representation of the command. A data strobe to data time tDQS2DQ is illustrated, as is a write strobe pause time tWPST.

Over times Tb0 and Tb1, mode register write commands are received to cause the frequency set point to change. In response, the frequency set point for the semiconductor device changes over the frequency change time tFC. During the frequency change time tFC, the reference voltage Vref may be updated for the new data output voltage VDDQ. The semiconductor device may be operated according to the new frequency set point following time Tc0.

At around time Tc0, the data output voltage VDDQ begins to decrease from the first voltage. As previously discussed, a change in data output voltage VDDQ indicates that a frequency set point for the semiconductor device will be changed. Decreasing the data output voltage VDDQ typically signals a change to a lower frequency set point. By time Td0 the data output voltage VDDQ has reached the lower second voltage.

A calibration command is received at time Td1 to perform a calibration operation, as represented by the MPC train/cal command. A calibration operation may be needed due to the change in data output voltage VDDQ from a first voltage (e.g., 0.5 volts) to a lower voltage (e.g., 0.3 volts). A ZQ calibration time tZQCAL is measured relative to the calibration command. During the ZQ calibration time tZQCAL the calibration process is performed.

At time Tc1 a ZQ calibration latch command is received by the semiconductor device to apply any new calibration parameters to adjust the impedances of the programmable termination components in the input/output circuits 17. In other embodiments, any changes to the calibration parameters are applied responsive to frequency set point change, which eliminates the need for the semiconductor device to receive a calibration latch command to apply the calibration parameters.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
    initiating a calibration operation of a memory when a change in temperature exceeds a temperature range;
    arbitrating with one or more other memories for use of an external resistance, with an arbitration engine of the memory;
    obtaining control of the external resistance; and
    performing the calibration operation after control of the external resistance is obtained.

2. The method of claim 1, further comprising:
    determining the change in temperature based, at least in part, by comparing a previous temperature to a current temperature; and
    determining whether the change in temperature exceeds a temperature range.

3. The method of claim 1, further comprising latching temperature information indicative of a current temperature.

4. The method of claim 3, wherein the temperature information comprises digital data.

5. The method of claim 3, wherein the temperature information comprises a voltage.

6. The method of claim 5 further comprising converting the voltage to a digital value.

7. A method comprising:
    initiating a calibration operation of a memory when a temperature exceeds or falls below a temperature limit;
    arbitrating with one or more other memories for use of an external resistance, with an arbitration engine of the memory;
    obtaining control of the external resistance; and
    performing the calibration operation after control the external resistance is obtained.

8. The method of claim 7, further comprising measuring the temperature with a temperature sensor.

9. The method of claim 8, wherein measuring the temperature comprises measuring the temperature of a semiconductor device including the memory.

10. The method of claim 7, further comprising comparing the temperature to the temperature limit.

11. The method of claim 7, further comprising initiating a second calibration operation of the memory when a time period elapses.

12. The method of claim 7, further comprising programming the temperature limit in a mode register.

13. The method of claim 7, wherein calibration operation comprises:
    performing ZQ calibration to determine calibration results for output driver impedance; and
    setting a value in a mode register at completion of the ZQ calibration to indicate if a new calibration result has been determined.

14. An apparatus, comprising:
    a memory including:
        a temperature sensor configured to provide temperature information indicative of a temperature; and
        an impedance calibration circuit configured to perform a calibration operation to arbitrate with another memory for use of an external resistance and determine calibration parameters based on the temperature information provided by the temperature sensor.

15. The apparatus of claim 14, wherein the impedance calibration circuit comprises:
    an impedance calibration engine configured to perform the calibration operation responsive to being activated and determine the calibration parameters; and
    an impedance calibration controller configured to initiate the calibration operation, the impedance calibration controller comprising:
        impedance calibration control logic configured to provide a calibration activation signal to activate the impedance calibration engine; and
        a temperature comparator configured to receive the temperature information and cause the impedance calibration control logic to activate the impedance calibration engine.

16. The apparatus of claim 15, wherein the impedance calibration controller further comprises a timer configured to cause the impedance calibration control logic to activate the impedance calibration engine responsive to a time period elapsing.

17. The apparatus of claim 14, further comprising a calibration flag circuit configured to program calibration information into a mode register.

18. The apparatus of 17, wherein the calibration information indicates whether the calibration information is completed.

19. The apparatus of claim 14, the impedance calibration circuit further comprises an arbitration engine configured to arbitrate with the other memory for the use of the external resistance.

20. The apparatus of claim 14, wherein the impedance calibration circuit is configured to perform the calibration operation based on the temperature information responsive to a change in the temperature exceeding a temperature range.

21. The apparatus of claim 14, wherein the impedance calibration circuit is configured to perform the calibration operation based on the temperature information responsive to the temperature exceeding or falling below a temperature limit.

* * * * *

UNITED STATES PATENT AND TRADEMARK OFFICE
CERTIFICATE OF CORRECTION

PATENT NO. : 11,916,527 B2
APPLICATION NO. : 18/047373
DATED : February 27, 2024
INVENTOR(S) : Dean Gans Page 1 of 1

It is certified that error appears in the above-identified patent and that said Letters Patent is hereby corrected as shown below:

In the Claims

| Column | Line | Claim | Reads | Should Read |
|---|---|---|---|---|
| 20 | 23 | 7 | performing the calibration operation after control the external resistance is obtained. | performing the calibration operation after control of the external resistance is obtained. |

Signed and Sealed this
Thirtieth Day of April, 2024

Katherine Kelly Vidal
*Director of the United States Patent and Trademark Office*